(12) United States Patent
Kyozuka et al.

(10) Patent No.: US 9,299,678 B2
(45) Date of Patent: Mar. 29, 2016

(54) SEMICONDUCTOR PACKAGE AND MANUFACTURING METHOD THEREFOR

(75) Inventors: Masahiro Kyozuka, Nagano (JP); Toru Hizume, Nagano (JP); Akihiko Tateiwa, Nagano (JP)

(73) Assignee: SHINKO ELECTRIC INDUSTRIES CO., LTD., Nagano-Shi (JP)

( * ) Notice: Subject to any disclaimer, the term of this patent is extended or adjusted under 35 U.S.C. 154(b) by 1020 days.

(21) Appl. No.: 13/326,502

(22) Filed: Dec. 15, 2011

(65) Prior Publication Data

US 2012/0153509 A1  Jun. 21, 2012

(30) Foreign Application Priority Data

Dec. 16, 2010  (JP) .................................. 2010-280951

(51) Int. Cl.
*H01L 23/02* (2006.01)
*H01L 23/00* (2006.01)
(Continued)

(52) U.S. Cl.
CPC ............ *H01L 24/19* (2013.01); *H01L 21/6835* (2013.01); *H01L 23/3157* (2013.01); *H01L 23/562* (2013.01); *H01L 24/20* (2013.01); *H01L 24/97* (2013.01); *H01L 25/0657* (2013.01); *H01L 25/50* (2013.01); *H05K 1/185* (2013.01); *H01L 2221/68372* (2013.01); *H01L 2224/12105* (2013.01); *H01L 2224/131* (2013.01); *H01L 2224/16145* (2013.01); *H01L 2224/221* (2013.01); *H01L 2224/32225* (2013.01); *H01L 2224/32245* (2013.01); *H01L 2224/73267* (2013.01); *H01L 2224/97* (2013.01);

(Continued)

(58) Field of Classification Search
CPC ............ H01L 2224/73265; H01L 2224/48091; H01L 2224/32145; H01L 23/5389; H01L 2924/0665; H01L 2924/00013; H01L 2224/97; H01L 2924/00; H01L 2224/131; H01L 2924/014; H01L 2924/1461; H01L 2924/15788; H01L 2224/05099; H01L 2224/05599; H01L 2224/13099; H01L 2224/13599; H01L 2224/2909
USPC .................. 257/678, 700, 706–707, 686, 729
See application file for complete search history.

(56) References Cited

U.S. PATENT DOCUMENTS

2007/0126085 A1* 6/2007 Kawano et al. ............... 257/621
2008/0318356 A1* 12/2008 Onozuka et al. ............... 438/51
(Continued)

FOREIGN PATENT DOCUMENTS

JP   2005-108937   4/2005
JP   2007-149731   6/2007
(Continued)

OTHER PUBLICATIONS

Japanese Office Action dated Jul. 29, 2014 with English translation, 7 pages.
(Continued)

*Primary Examiner* — H Tsai
(74) *Attorney, Agent, or Firm* — Rankin, Hill & Clark LLP

(57) ABSTRACT

According to one embodiment, there is provided a semiconductor package including: a semiconductor chip; a resin portion formed to cover the semiconductor chip; a wiring structure formed on the resin portion and electrically connected to the semiconductor chip; and a warpage preventing member provided above the resin portion to have a thermal expansion coefficient closer to that of the semiconductor chip than to that of the wiring structure.

9 Claims, 19 Drawing Sheets

(51) Int. Cl.
*H01L 23/31* (2006.01)
*H01L 25/065* (2006.01)
*H05K 1/18* (2006.01)
*H01L 21/683* (2006.01)
*H01L 25/00* (2006.01)
*H05K 3/46* (2006.01)

(52) U.S. Cl.
CPC ............... *H01L2225/06548* (2013.01); *H01L 2924/00013* (2013.01); *H01L 2924/014* (2013.01); *H01L 2924/01005* (2013.01); *H01L 2924/01006* (2013.01); *H01L 2924/01013* (2013.01); *H01L 2924/01029* (2013.01); *H01L 2924/01033* (2013.01); *H01L 2924/01079* (2013.01); *H01L 2924/09701* (2013.01); *H01L 2924/10329* (2013.01); *H01L 2924/1461* (2013.01); *H01L 2924/15788* (2013.01); *H01L 2924/18162* (2013.01); *H05K 3/4682* (2013.01); *H05K 2201/09136* (2013.01)

(56) References Cited

U.S. PATENT DOCUMENTS

2011/0291293 A1* 12/2011 Tuominen et al. ............ 257/774
2012/0074588 A1* 3/2012 Hsiao et al. .................... 257/777
2012/0133052 A1* 5/2012 Kikuchi et al. ............... 257/774

FOREIGN PATENT DOCUMENTS

| JP | 2008-211213 | 9/2008 |
| JP | 2008-252087 | 10/2008 |
| JP | 2008-306071 | 12/2008 |
| WO | 03/049184 | 6/2003 |

OTHER PUBLICATIONS

Japanese Office Action and English Translation dated Nov. 25, 2014, 8 pages.

* cited by examiner

SEMICONDUCTOR PACKAGE AND MANUFACTURING METHOD THEREFOR

CROSS-REFERENCE TO RELATED APPLICATION(S)

This application claims priority/priorities from Japanese Patent Application No. 2010-280951 filed on Dec. 16, 2010, the entire contents of which are incorporated herein by reference.

FIELD

The present invention relates to a semiconductor package having a semiconductor chip and a resin portion that covers the semiconductor chip and to a manufacturing method therefor.

BACKGROUND

Generally, a semiconductor package has a structure in which a semiconductor chip is covered with a resin portion.

For example, side surfaces and an active surface (circuit forming surface) of a semiconductor chip may be covered with a resin portion. And, a wiring structure in which a wiring layer electrically connected to the semiconductor chip and an insulating layer are stacked may be further formed on the resin portion.

For example, JP-2008-306071-A discloses a manufacturing method for such a semiconductor chip.

First, a supporting body is prepared. A semiconductor chip is mounted on the prepared supporting body such that a surface of the semiconductor chip, which is opposite to an active surface thereof, touches a surface of the supporting body. Then, the mounted semiconductor chip is sealed with a resin portion. Thereafter, a wiring layer and an insulating layer are stacked on the resin portion to form a wiring structure. Then, the supporting body is removed. Thus, a semiconductor package is manufactured.

In such manufacturing process, no warpage of the semiconductor package occurs and sufficient stiffness is provided, as long as a semiconductor chip is arranged on a supporting body. However, after the supporting body has been removed, warpage of a semiconductor package may be caused, and stiffness of the semiconductor package may become insufficient.

Since such warpage occurs due to thermal history obtained during a thermal treatment, e.g., solder reflowing, the amount of warpage may further increase during such thermal treatment.

SUMMARY

According to one embodiment, there is provided a semiconductor package including: a semiconductor chip; a resin portion formed to cover the semiconductor chip a wiring structure formed on the resin portion and electrically connected to the semiconductor chip; and a warpage preventing member provided above the resin portion to have a thermal expansion coefficient closer to that of the semiconductor chip than to that of the wiring structure.

According to the present application, there is provided a semiconductor package capable of preventing the warpage of a semiconductor package and improving stiffness, and a manufacturing method for such a semiconductor package.

DETAILED DESCRIPTION

Hereinafter, embodiments are described with reference to the drawings.

First Embodiment

Structure According to First Embodiment

Figure 1:
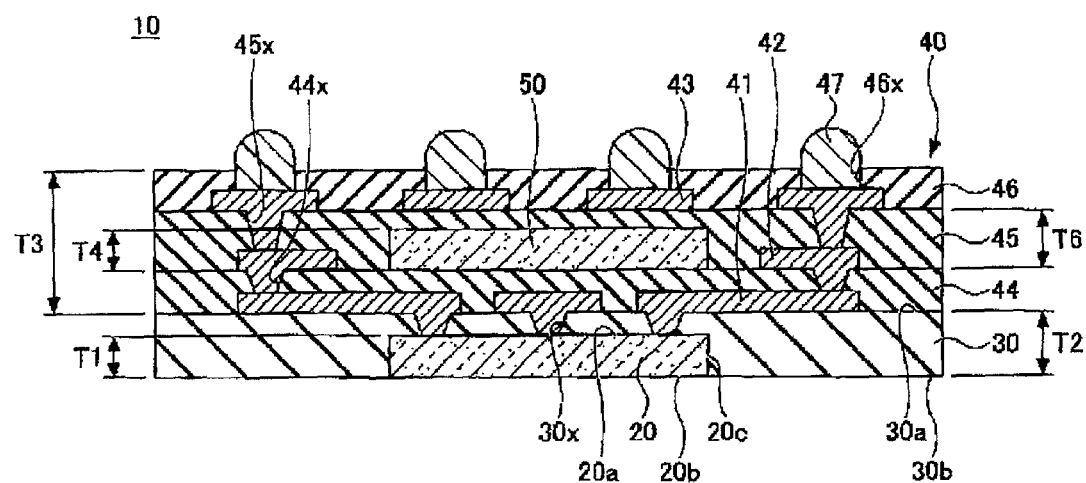
FIG. 1 cross-sectionally illustrates a semiconductor package according to a first embodiment.

FIG. 1 cross-sectionally illustrates a semiconductor package according to the first embodiment. Referring to FIG. 1, a semiconductor package 10 includes a semiconductor chip 20, a resin portion 30, a wiring structure 40, and a warpage preventing member 50.

The semiconductor chip 20 includes a semiconductor substrate. In the semiconductor chip 20, a semiconductor integrated circuit (not shown) and an electrode pad are formed on, e.g., a surface 20a located at the same side with the side of the wiring structure 40. As viewed from above, the size of the semiconductor chip 20 may be set at, e.g., about 12 millimeters (mm)×12 mm. The thickness T1 of the semiconductor chip 20 may be set at, e.g., about 100 micrometers (μm) (an applicable range is from 50 μm to 200 μm). The surface 20a on which the semiconductor integrated circuit and an electrode pad are formed may also be referred to as a "circuit forming surface 20a".

For example, a silicon (Si) substrate may be employed as the semiconductor substrate. The semiconductor integrated circuit (not shown) formed on the circuit forming surface 20a has a diffusion layer, an insulating layer, a via-hole, and wiring or the like (not shown). An electrode pad (not shown) is provided on the semiconductor integrated circuit formed on the circuit forming surface 20a. The electrode pad is electrically connected to the semiconductor integrated circuit.

The resin portion 30 is formed to cover the circuit forming surface 20a and a surface (side surface) 20c of the semiconductor chip 20. A surface 30a of the resin portion 30 at the side of the wiring structure 40 is flat, and a surface 30b opposite to the surface 30a is substantially flush with a surface 20b of the semiconductor chip 20. The thickness T2 of the resin portion 30 may be set at a value sufficient to enclose the chip 20 having a thickness T1 therein.

The wiring structure 40 is configured by alternately stacking winging layers and insulating layers. The number of the wiring layers may be set at a given value, and the number of the insulating layers may be set at a value at which the wiring layers are insulated from one another by the insulating layers. According to the example illustrated in FIG. 1, the wiring structure 40 includes a first wiring layer 41, a second wiring layer 42, an third wiring layer 43, a first insulating layer 44, and a second insulating layer 45.

The wiring structure 40 is formed above the surface 30a of the resin portion 30. The thickness T3 of the wiring structure 40 may be set at, e.g., about 400 µm.

The first wiring layer 41 is formed on the surface 30a of the resin portion 30. The first wiring layer 41 is electrically connected to an electrode pad (not shown) formed on the circuit forming surface 20a of the semiconductor chip 20 via a via-hole 30x penetrating-through the resin portion 30.

The first insulating layer 44 is formed on/in the surface 30a of the resin portion 30 to cover the first wiring layer 41. The second wiring layer 42 is formed on the first insulating layer 44 and electrically connected to the first wiring layer 41 via a first via-hole 44x penetrating-through the first insulating layer 44. The second insulating layer 45 is formed on the first insulating layer 44 to cover the second wiring layer 42. The third wiring layer 43 is formed on the second insulating layer 45 and electrically connected to the second wiring layer 42 via a second via-hole 45x.

For example, Cu-layers may be used as the first wiring layer 41, the second wiring layer 42, and the third wiring layer 43. For example, layers made of resin materials, such as epoxy resin materials, may be used as the first insulating layer 44 and the second insulating layer 45. The second insulating layer 45 also covers a warpage preventing member 50.

A solder resist layer 46 is formed on the second insulating layer 45 to cover the third wiring layer 43. Openings 46x are formed in the solder resist layer 46 to partially expose the third wiring layer 43. Exposed portions of the third wiring layer 43 function as an electrode pad connected to a motherboard and the like.

A metal layer may be formed on the third wiring layer 43 exposed through the opening 46x. A gold (Au) layer, a Ni/Au layer formed by stacking a Ni-layer and an Au-layer in this order, a Ni/Pd/Au layer formed by stacking a Ni-layer, and a Pd-layer, and an Au-layer in this order may be used as the metal layer. Alternatively, an organic solderability preservative (OSP) treatment may be performed on the third wiring layer 43 exposed through each opening 46x of the solder resist layer 46, instead of forming the metal layer thereon.

A solder ball 47 is mounted on each exposed portion of the third wiring layer 43.

The warpage preventing member 50 is provided above the resin portion 30. Hereinafter, a case where the warpage preventing member 50 is provided in the second insulating layer 45 is exemplified. The warpage preventing member 50 prevents the warpage of the semiconductor package after the supporting body, which will be described below, is removed in a process of manufacturing the semiconductor package.

The warpage preventing member 50 has a thermal expansion coefficient, which is closer to the thermal expansion coefficient of the semiconductor chip 20 than to that of the wiring structure 40. More specifically, the warpage preventing member 50 is formed as, e.g., a member that has a thermal expansion coefficient and a Young's modulus which are closer to those of the semiconductor chip 20 than to those of each insulating layer, respectively.

The warpage preventing member 50 may be provided in one of the insulating layers 44 and 45 or on the solder resist layer 46. It may be preferable for more efficiently preventing the warpage of the semiconductor package to provide the warpage preventing member 50 at the side of the wiring structure 40, which is opposite to the semiconductor chip 20.

Figure 2A:
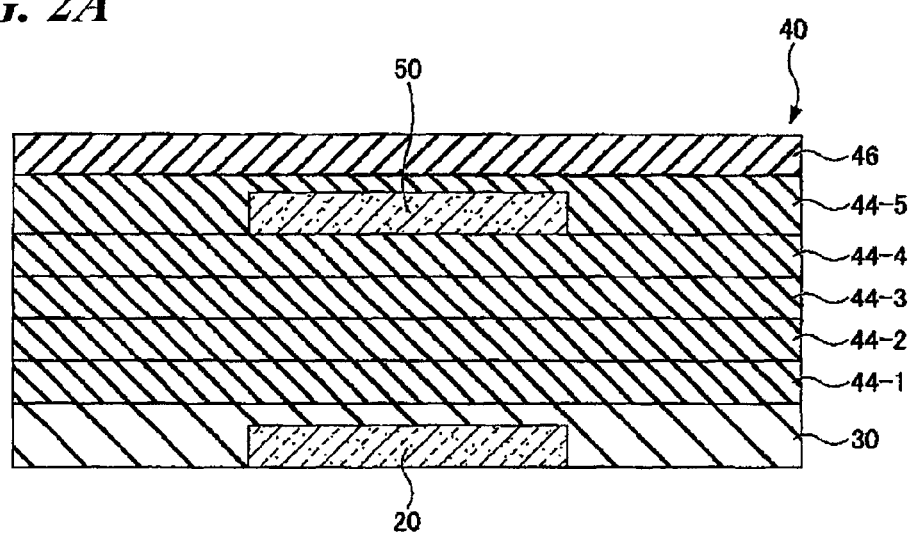
FIGS. 2A and 2B illustrate a position of a warpage preventing member in a case where an insulating layer is multilayered.
Figure 2B:
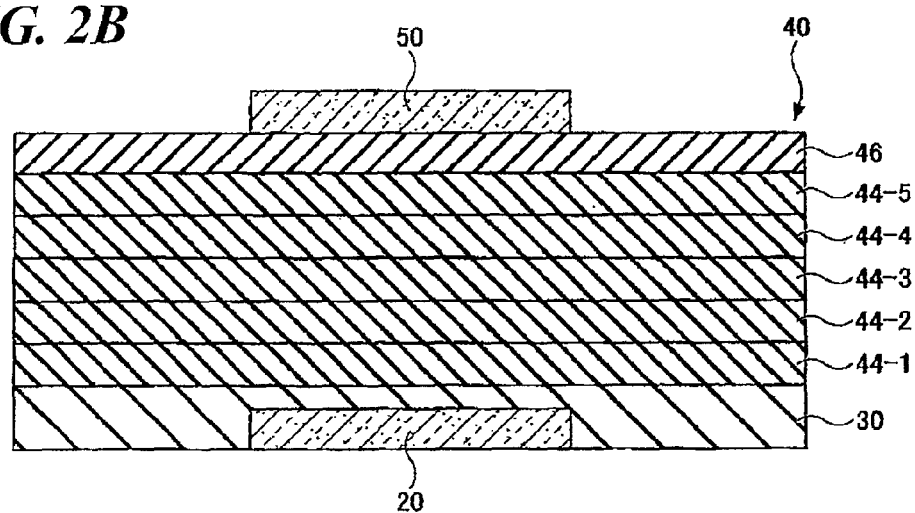

FIGS. 2A and 2B illustrate a position of the warpage preventing member in a case where the insulating layer is multilayered, more particularly, the wiring structure has five insulating layers. In FIGS. 2A and 2B, portions other than the semiconductor chip 20, the warpage preventing member 50, the insulating layers 44-1 to 44-5, and the solder resist layer 46 is omitted.

For example, in the semiconductor package, the wiring structure 40 includes alternately-stacked six wiring layers and five insulating layers 44-1 to 44-5, and the solder resist layer 46 is formed on the wiring structure 40. In the multilayered structure, as illustrated in FIG. 2A, the warpage preventing member 50 may be provided in the frontmost insulating layer 44-5 of the wiring structure 40, which is opposite to the semiconductor chip 20. Alternatively, as illustrated in FIG. 2B, the warpage preventing member 50 may be provided on the solder resist layer 46.

From the viewpoint of preventing the warpage of the semiconductor package, it is most effective to provide the warpage preventing member 50 on a surface (i.e., a surface of the solder resist layer 46) opposite to a side of the wiring structure 40 touching the resin portion 30.

If the warpage preventing member 50 is simply provided on the surface of the solder resist layer 46, the arrangement of the electrode pad to be connected to the motherboard or the like, and the design of the wiring may be restricted.

When the warpage preventing member 50 is provided in the frontmost insulating layer 44-5 opposite to the side of the wiring structure 40 touching the resin portion 30, the flexibility of the arrangement of the electrode pad and the design of the wiring may be assured, while the warpage preventing effect is high.

Various electronic components, such as semiconductor chips, electrically connected to the wiring structure 40, or dummy chips which are not electrically connected to the wiring structure 40, may be provided as the warpage preventing member 50. FIG. 1 exemplifies a case where a dummy chip is provided as the warpage preventing member 50.

When a resin material, e.g., an epoxy resin is used as the second insulating layer 45, a plate-like member made of, e.g., silicon, glass, or a 42-alloy may be used as the warpage preventing member 50. As the glass, e.g., soda glass, and alkali-free glass may be used.

The "42-alloy" means an alloy containing nickel (Ni) and iron (Fe), which is formed such that the weight % of Ni is about 42%. A small amount of other materials such as copper (Cu) and manganese (Mn) may be added to the 42-alloy.

When the glass transition temperature of an epoxy resin is set at Tg (150° C.), the thermal expansion coefficient of an epoxy resin is 46 ppm/° C. at temperature lower than Tg, while the thermal expansion coefficient of an epoxy resin is 120 ppm/° C. at temperature equal to or higher than Tg. The thermal expansion coefficient of silicon is 3.4 ppm/° C., that of alkali-free glass is 3.25 ppm/° C., that of soda glass is 8 ppm/° C., and that of a 42-alloy is 4.3 ppm/° C. Accordingly, by forming the warpage preventing member 50 with silicon, glass, or a 42-alloy, the warpage preventing member 50 has a thermal expansion coefficient closer to that of the second insulating layer 45 than to that of the semiconductor chip 20.

Consequently, the thermal expansion coefficient corresponding to a side of the semiconductor package 10, which is at the side of the wiring structure 40 and is opposite to the semiconductor chip 20, may be made close to that at a side of the semiconductor package 10, which is the same side with the semiconductor chip 20. Thus, the warpage of the semiconductor package 10 may be prevented, regardless of the presence/absence of thermal history.

As the material for the warpage preventing member 50, various materials, e.g., compound semiconductors such as GaAs, glass such as quartz glass, and ceramics such as zirconia and sapphire other than silicon, glass, a 42-alloy may be used.

Preferably, the warpage preventing member 50 is higher in reflecting strength measured by a three-point bending test or a four-point bending test than the wiring structure 40. And, preferably, the warpage preventing member 50 has a Young's modulus higher than that of the wiring structure 40. Consequently, the stiffness of a semiconductor package may be enhanced even after the supporting body, which will be described below, is removed in the process of manufacturing a semiconductor package.

The thickness T4 of the warpage preventing member 50, which is necessary for preventing the warpage of a semiconductor package and enhancing the stiffness thereof, depends upon the values of the thermal expansion coefficient, and the Young's modulus of the semiconductor package and the thickness of an incorporated semiconductor chip. For example, the thickness T4 of the warpage preventing member 50 may be set at, e.g., about 50 µm (an applicable range is from 10 µm to 100 µm).

Manufacturing Method according to First Embodiment

Next, a method for manufacturing a semiconductor package according to the first embodiment is described. FIGS. 3 to 11 are cross-sectional views exemplifying a process of manufacturing a semiconductor package according to the first embodiment. In FIGS. 3 to 11, the same portion as that illustrated in FIG. 1 is designated with the same reference numeral, and the description thereof may be omitted. Reference character E shown in each of FIGS. 3 to 11 indicates a position at which the structure is cut after a step illustrated in FIG. 11.

Figure 3:
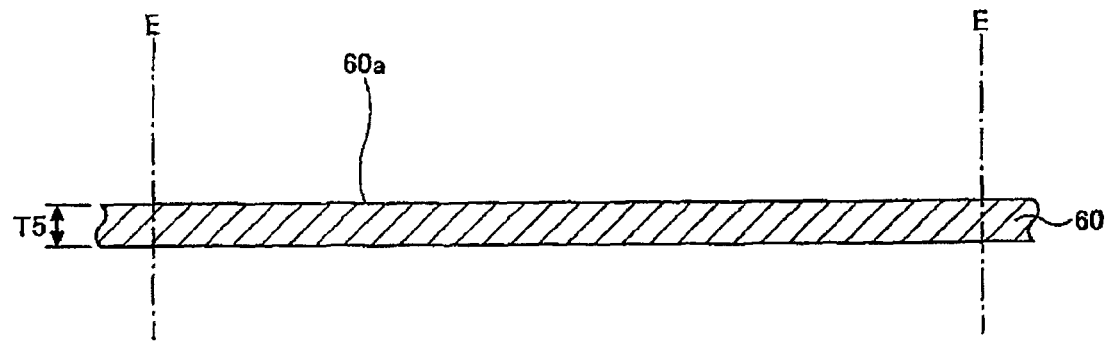
FIGS. 3 to 11 illustrate a process of manufacturing a semiconductor package according to the first embodiment.

First, in step illustrated in FIG. 3, a supporting body 60 is prepared.

The supporting body 60 may be formed as, e.g., a flat plate having a rectangular-shape, as viewed from above. The thickness T5 of the supporting body 60 may be set at, e.g., about 50 µm (an applicable range is from 10 µm to 200 µm).

As the supporting body 60, various materials, e.g., metals such as copper (Cu), nickel (Ni), and Ni—Fe alloys such as the above 42-alloy, aluminum (Al), and ceramics may be used. In this embodiment, a supporting body formed of a Cu metal plate or foil is exemplified.

Figure 4:
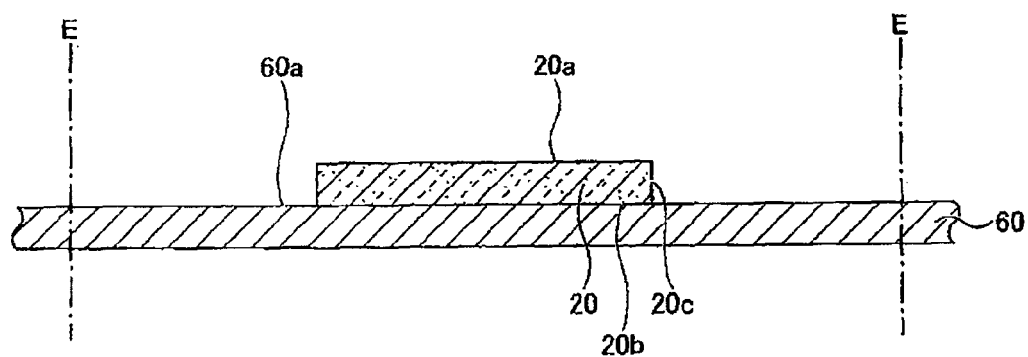

In the step illustrated in FIG. 4, the semiconductor chip 20 is arranged on a surface 60a of the prepared supporting body 60. Specifically, the semiconductor chip 20 is arranged correspondingly with each of the individual semiconductor packages. Thus, plural semiconductor chips 20 are arranged on the supporting body 60.

For example, a semiconductor wafer having plural semiconductor chips 20 is preliminarily prepared. The thickness T1 of the semiconductor wafer 21 (the thickness T1 of the semiconductor chip 20) may be set at, e.g., about 100 µm (an applicable range is from 50 µm to 200 µm). Then, the semiconductor wafer is cut with a dicing blade or the like to individualize the semiconductor chips 20. Next, the individualized semiconductor chips 20 are arranged on the surface 60a of the supporting body 60 such that the surface 20b of each semiconductor chip 20, which is opposite to the surface 20a, faces the surface 60a of the supporting body 60. The distance between the adjacent semiconductor chips 20 may be set at a given value.

An adhesive layer (not shown) may preliminarily be formed on the surface 20b of the semiconductor chip 20. More specifically, before the semiconductor wafer is cut into the individualized semiconductor chips 20, an adhesive material film (not shown) may preliminarily be attached onto the surface 20b of the semiconductor chip 20 with, e.g., a roll laminator. For example, an epoxy resin may be used for the adhesive layer. The thickness of the adhesive layer may be set at, e.g., about 10 µm to about 20 µm.

Each semiconductor chip 20 arranged on the surface 60a of the supporting body 60 in this manner is pressurized so as to be fixed onto the surface 60a of the supporting body 60 via the adhesive layer (not shown) in a faceup state.

Figure 5:
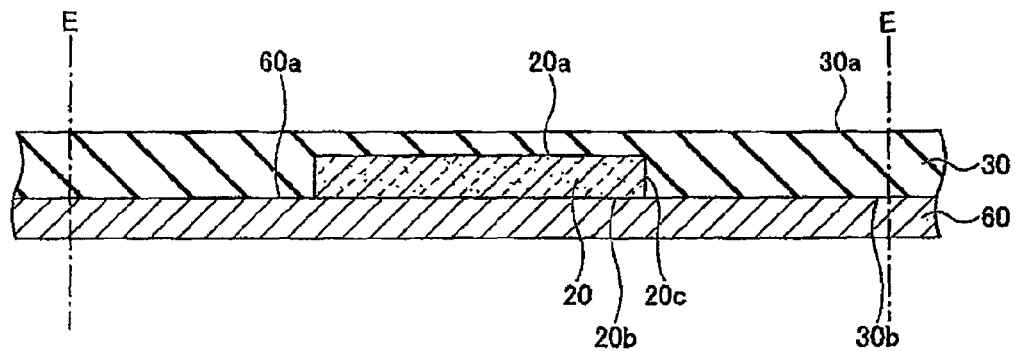

In the step illustrated in FIG. 5, the resin portion 30 is formed on the surface 60a of the supporting body 60 to cover each semiconductor chip 20. More specifically, the resin portion 30 is formed by stacking, e.g., epoxy or polyimide resin films. For example, semi-cured thermosetting epoxy resin films are stacked on the supporting body 60 to cover each semiconductor chip 20. Then, the stacked films are heated and pressurized in a vacuum atmosphere, to thereby form the resin portion 30.

Figure 6:
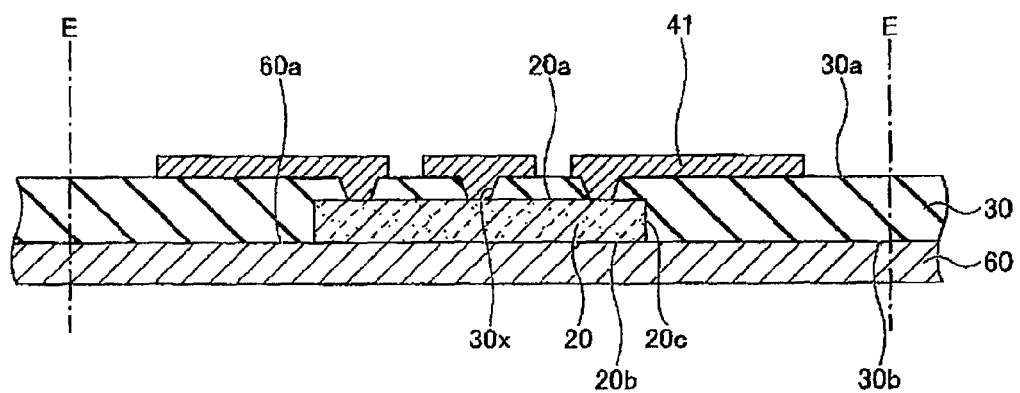

In the step illustrated in FIG. 6, the first wiring layer 41 is formed on the surface 30a of the resin portion 30 to be electrically connected to each semiconductor chip 20.

For example, via-holes 30x are previously formed in the resin portion 30 to each penetrate-through the resin portion 30, using a laser processing method or the like, to thereby expose an electrode pad (not shown) formed on the circuit forming surface 20a. Then, the first wiring layer 41 is formed on the surface 30a of the resin portion 30 to be electrically connected to the electrode pad exposed through the via-hole 30x. For example, a copper (Cu) may be used for the first wiring layer 41. The first wiring layer 41 is formed by, e.g., a semi-additive method. The first wiring layer 41 includes a via-conductor provided in the via-hole 30x and a wiring pattern formed on the resin portion 30.

As the semi-additive method, for example, first, Cu seed layers (not shown) are formed on the electrode pads exposed on the inner wall and the bottom surface of the via-hole 30x and on the resin portion 30 by a nonelectrolytic plating method or a sputtering method. Then, a resist layer (no shown) having an opening corresponding to the first wiring method 41 is formed on each Cu seed layer (not shown). Next, a Cu-layer pattern (not shown) is formed in the opening of each resist layer (not shown) by an electrolytic plating method utilizing each Cu seed layer as a power feeding layer. Then, the resist layers (not shown) are removed. After that, the first wiring layer 41 is obtained by etching the Cu seed layers using the Cu-layer pattern as a mask.

The via-conductor may be obtained by filling the via-hole 30x with a metal layer (i.e., a Cu-layer).

In addition to the above semi-additive method, various wiring formation methods such as a subtractive method may be used to form the first wiring layer 41.

Figure 7:
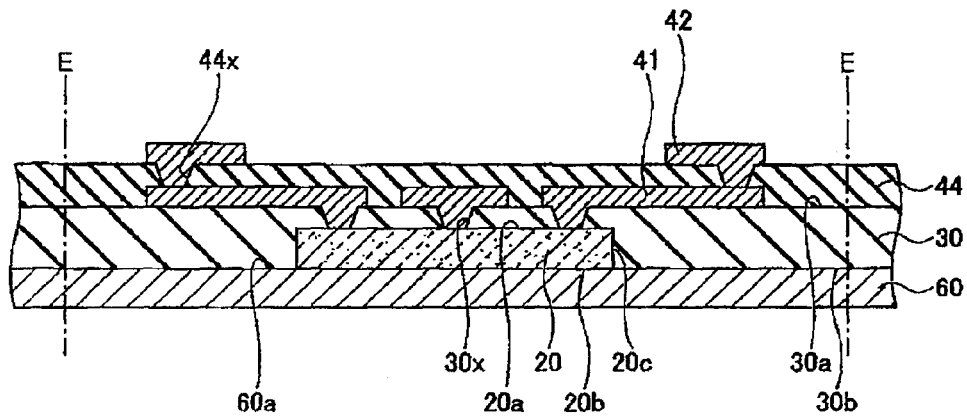

In the step illustrated in FIG. 7, the first insulating layer 44 and the second wiring layer 42 are formed.

First, the first insulating layer 44 is formed on the surface 30a of the resin portion 30 to cover the first wiring layer 41.

Resin materials such as an epoxy resin and a polyimide resin may be used for the first insulating layer 44. The first insulating layer 44 may be formed as follows. That is, semi-cured thermosetting epoxy resin films are laminated while being pressed onto the first wiring layer 41 and the surface 30a of the resin portion 30. Then, the semi-cured thermosetting epoxy resin films are cured by being heated to a temperature of e.g., about 190° C. and pressurized in a vacuum atmosphere.

After that, the first via-hole 44x penetrating-through the first insulating layer 44 is formed in the first insulating layer 44 using a laser processing method or the like so as to expose the first wiring layer 41. Alternatively, a photosensitive resin film may be used as the first insulating layer 44, and the first via-hole 44x may be formed by performing patterning thereon, with photolithography. Further alternatively, the first via-holes 44x may be formed by performing patterning on the resin film provided with the opening, with screen-printing.

Then, the second wiring layer 42 is formed on the first insulating layer 44 to be electrically connected to the first wiring layer 41 via the first via-hole 44x. For example, copper (Cu) may be used for the second wiring layer 42. The second wiring layer 42 is formed by, e.g., the semi-additive method.

Figure 8:
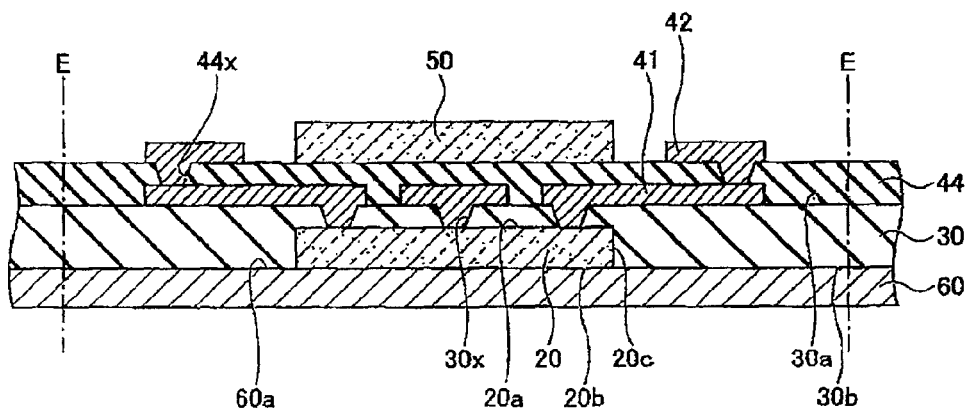

In the step illustrated n FIG. 8, the warpage preventing member 50 is arranged on the first insulating layer 44.

For example, as in the step for individualization of the semiconductor chip 20, a substrate, such as a semiconductor wafer, a glass substrate, and a substrate made of a 42-alloy, is preliminary prepared. The thickness T4 of the substrate (i.e., the thickness of the warpage preventing member 50) may be set at, e.g., about 50 μm. The substrate is individualized into plural warpage preventing members 50, and each warpage preventing member 50 is arranged on the first insulating layer 44.

The warpage preventing member 50 prevents occurrence of warpage due to the difference in thermal expansion coefficient between the semiconductor chip 20 and the wiring structure 40. Thus, preferably, the warpage preventing member 50 is arranged to be opposite to the semiconductor chip 20. In addition, preferably, the warpage preventing members 50 are arranged at intervals substantially equal to the intervals between the adjacent semiconductor chips 20.

An adhesive layer (not shown) may preliminarily be formed on a surface of the warpage preventing member 50, which touches the first insulating layer 44. More specifically, the adhesive material film (not shown) may preliminarily be attached to the surface of each warpage preventing member 50 touching the first insulating layer 44, before the substrate is cut into the individualized warpage preventing members 50. For example, an epoxy resin or the like may be used for the adhesive layer. The thickness of the adhesive layer may be set at, e.g., about 10 μm to about 30 μm.

Thus, each warpage preventing member 50 arranged on the first insulating layer 44 is pressurized. Consequently, each warpage preventing member 50 is fixed onto the first insulating layer 44 via the adhesive layer (not shown).

Figure 9:
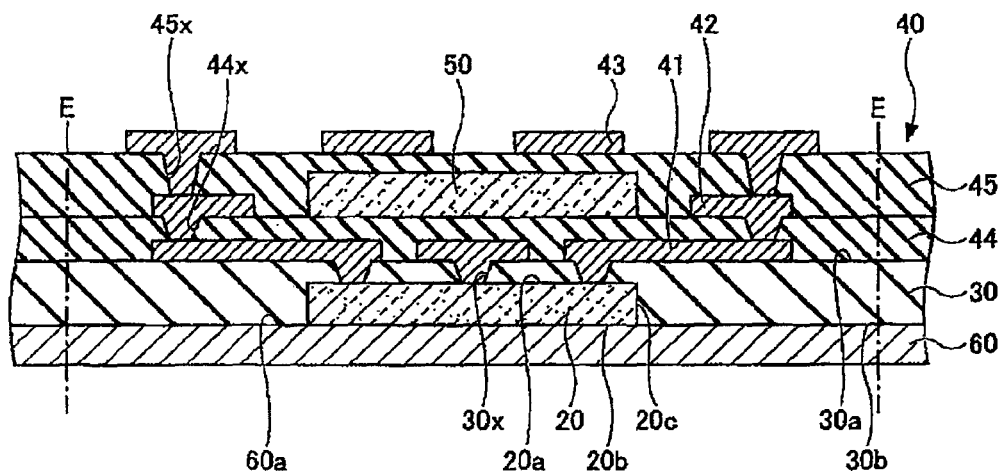

In the step illustrated in FIG. 9, the second insulating layer 45 and the third wiring layer 43 are formed.

First, the second insulating layer 45 is formed on the first insulating layer 44 to cover the second wiring layer 42 and the warpage preventing member 50. As in the step of forming the first insulating layer 44, the second insulating layer 45 may be formed by stacking, e.g., epoxy or polyimide resin films. The thickness T6 of the second insulating layer 45 may be set to be equal to or more than, e.g., 80 μm.

Then, similarly to the first insulating layer 44, the second via-hole 45x is formed in the second insulating layer 45 to penetrate therethrough, using, e.g., a laser processing method or the like, to thereby expose the second wiring layer 42.

Then, the third wiring layer 43 is formed on the second insulating layer 45 to be electrically connected to the second wiring layer 42 via the second via-hole 45x. For example, a copper (Cu) layer is used as the third wiring layer 43. The third wiring layer 43 is formed by, e.g., a semi-additive method.

Consequently, in a state where the warpage preventing member 50 is provided, a buildup wiring layer is formed on the surface 30a of the resin portion 30. According to the first embodiment, three buildup wiring layers (the first wiring layer 41 to the third wiring layer 43) are formed. However, n buildup wiring layers ("n" is an integer equal to or larger than 1) may be formed.

Figure 10:
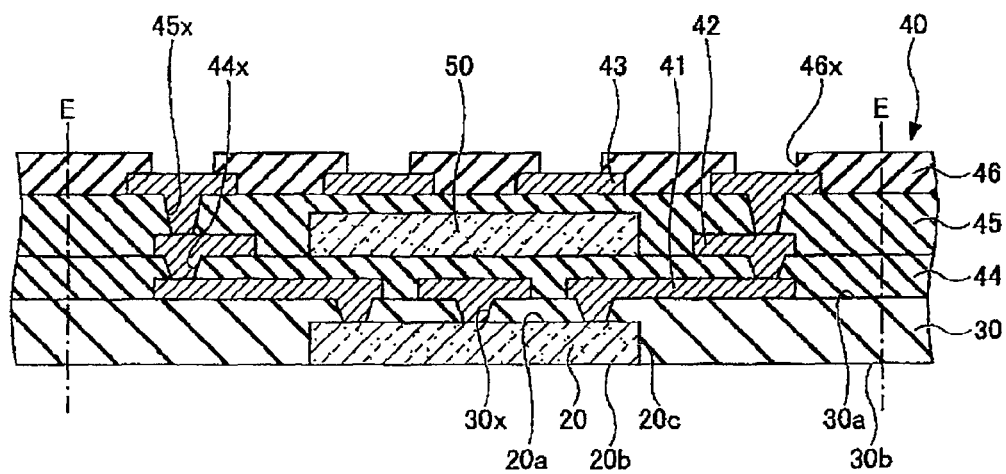

In the step illustrated in FIG. 10, the solder resist layer 46 is formed, and the opening 46x is formed. Then, the supporting body 60 may be removed.

The solder resist layer 46 is formed by applying solder resist onto the second insulating layer 45 to cover the third wiring layer 43. Then, the solder resist layer 46 is exposed and developed to form the openings 46x. Consequently, the third wiring layer 43 is partially exposed by the openings 46x. For example, photosensitive resin compositions including, e.g., an epoxy resin and an imide resin may be used for the solder resist layer 46. Exposed portions of the third wiring layer 43 function as an electrode pad connected to a motherboard and the like.

A metal layer may be formed on the third wiring layer 43 through the openings 46x by, e.g., nonelectrolytic plating. An Au-layer, a Ni/Au layer formed by stacking a Ni-layer and an Au-layer in this order, a Ni/Pd/Au layer formed by stacking a Ni-layer, and a Pd-layer, and an Au-layer in this order may be used as the metal layer. Alternatively, an OSP treatment may be performed on the third wiring layer 43 through the openings 46x, instead of forming the metal layer thereon.

Then, the supporting body 60 is removed. When the supporting body 60 is made of copper (Cu), the supporting body 60 may be removed by etching using, e.g., an aqueous ferric chloride.

Figure 11:
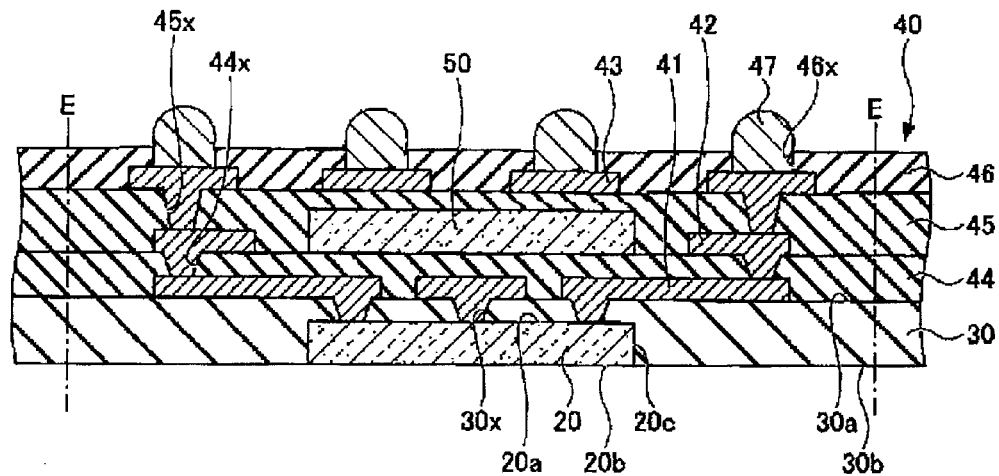

In the step illustrated in FIG. 11, solder balls 47 are mounted on the third wiring layer 43 through the openings 46x.

Then, the structure illustrated in FIG. 11 is individualized by being cut at, e.g., the position E which is a position between the adjacent semiconductor chips. Consequently, the semiconductor package 10 illustrated in FIG. 1 is completed.

Next, the first embodiment is compared with a comparative example in terms of the warpage prevention and the stiffness of a semiconductor package.

Figure 12:
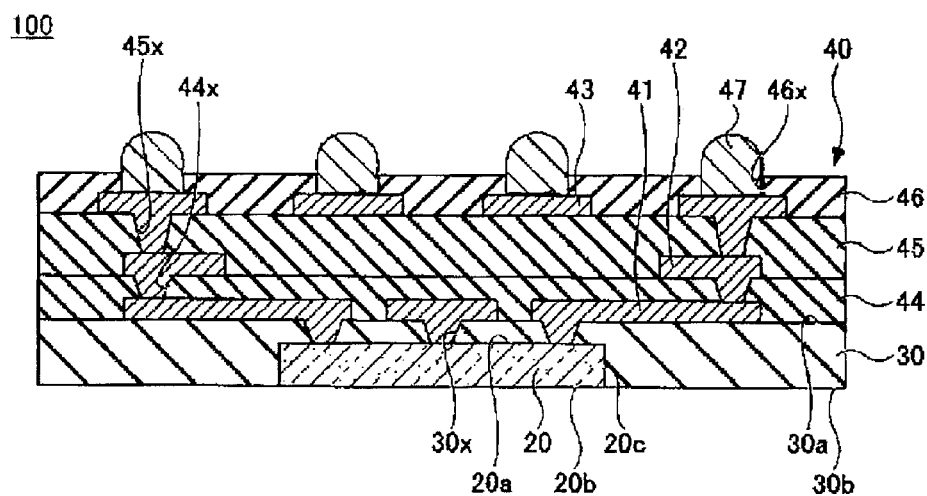
FIG. 12 cross-sectionally illustrates a semiconductor package according to a comparative example.

FIG. 12 cross-sectionally illustrates a semiconductor package according to the comparative example. Referring to FIG. 12, the structure of a semiconductor package 100 is the same with the structure the semiconductor package 10 according to the first embodiment, except for a warpage preventing member. Since the semiconductor chip 20 and the resin portion 30 in the comparative example are the same as those in the first embodiment, the description thereof is omitted.

The structure of he wiring structure 40 in the comparative example is the same with the wiring structure 40 in the first embodiment, except that the warpage preventing member is not enclose in the second insulating layer 45. Structures of the wiring layers 41 to 43 and the first insulating layer 44 are common between the comparative example and the first embodiment.

A manufacturing method for a semiconductor package according to the comparative example is similar to the manufacturing method for a semiconductor package, which has been described with reference to FIGS. 3 to 11, except the steps illustrated in FIGS. 8 to 11. Thus, the description of the similar steps is omitted.

Figure 13:
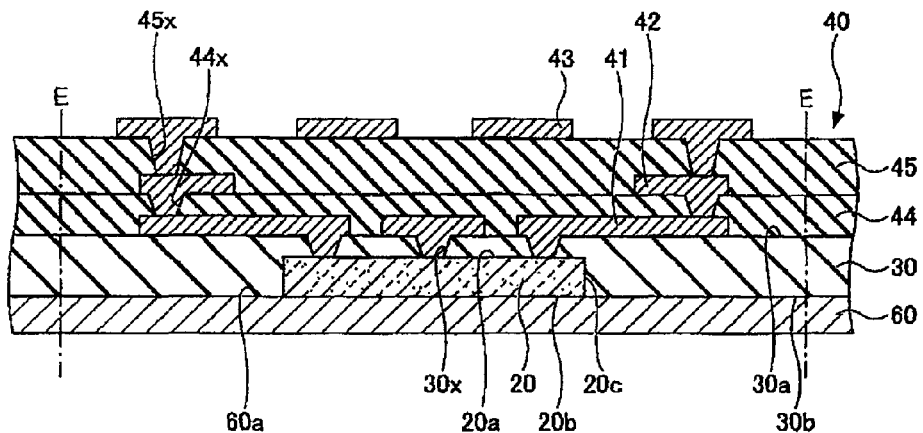
FIGS. 13 and 14 illustrate a process of manufacturing a semiconductor package according to the comparative example.
Figure 14:
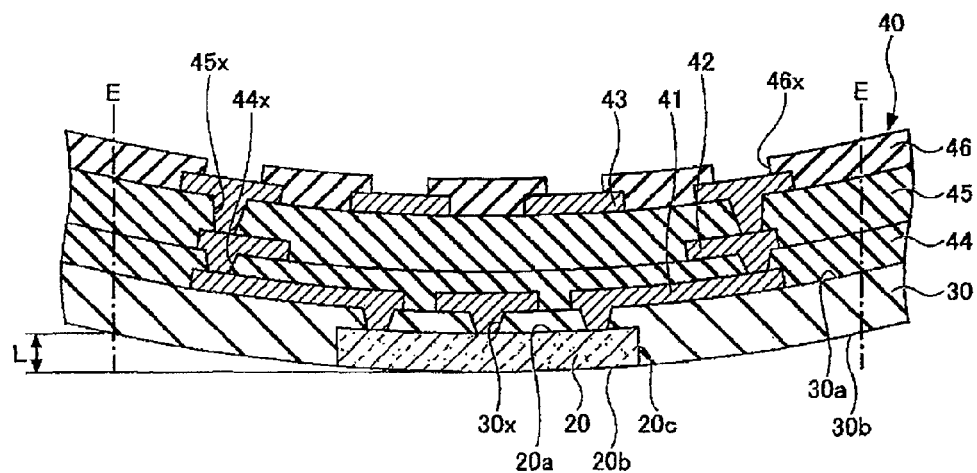

According to the comparative example, the steps illustrated in FIGS. 13 and 14 are performed, instead of the steps illustrated in FIGS. 8 to 11.

In FIGS. 13 and 14, each component is designated with the same reference numeral as in FIG. 12. Reference character E illustrated in FIGS. 13 and 14 indicates a position at which the structure illustrated therein is to be cut.

After the step illustrated in FIG. 7, in the step illustrated in FIG. 13, the second insulating layer 45 and the third wiring layer 43 are formed, similarly to the step illustrated in FIG. 9. Meanwhile, no warpage preventing member is arranged on the first insulating layer 44, and the second insulating layer 45 does not cover the warpage preventing member.

In the step illustrated in FIG. 14, the solder resist layer 46 is formed, and the supporting body 60 is removed after the opening 46x is formed, similarly to the step illustrated in FIG. 10.

In the semiconductor package 100 according to the comparative example, no warpage preventing member is provided on the wiring structure 40 formed on the resin portion 30, i.e., at the side opposite to the semiconductor chip 20. At the side of the semiconductor chip 20 of the semiconductor package, a shrinkage amount caused at cooling, after performing the heat treatment, depends upon the thermal expansion coefficient of the semiconductor chip 20, i.e., the thermal expansion coefficient of silicon. On the other hand, at the side opposite to the semiconductor chip 20 of the semiconductor package, a shrinkage amount caused at cooling after performing the heat treatment depends upon the thermal expansion coefficient of the wiring structure 40, i.e., the thermal expansion coefficient of the second insulating layer 45 and the like. As described above, while the thermal expansion coefficient of silicon is 3.4 ppm/° C., the thermal expansion coefficient of an epoxy resin (the second insulating layer 45) is 46 ppm/° C. at temperature lower than Tg and 120 ppm/° C. at temperature equal to or higher than Tg. Thus, in the semiconductor package 100, the thermal expansion coefficient extremely differs among both sides. Accordingly, a shrinkage amount caused at cooling, after performing the heat treatment, at the side of the wiring structure 40 differs from that at the side of the semiconductor chip 20. After the removal of the supporting body 60, as illustrated in FIG. 14, the semiconductor package 100 is easy to warp.

A warpage amount L of a semiconductor package, which is illustrated in FIG. 14, is defined as a difference in height between the lowest point and the top point of an individualized semiconductor. The sign of the warpage amount L is defined as follows. That is, first, it is assumed that the side of the semiconductor chip 20 is a lower side, while the side of the wiring structure 40 is an upper side. Thus, the sign of the warpage amount is negative when the semiconductor package warps by being deformed into an upwardly convex shape. On the other hand, the sign of the warpage amount is positive when the semiconductor package warps by being deformed into a downwardly convex shape.

On the other hand, in the semiconductor package 10 according to the first embodiment, the warpage preventing member 50 is provided above the resin portion 30, more particularly, on the wiring structure 40 formed on the resin portion 30. The warpage preventing member 50 has a thermal expansion coefficient closer to that of the semiconductor chip 20 than to that of the wiring structure 40. More specifically, the warpage preventing member 50 has a thermal expansion coefficient closer to that (e.g., 3.4 ppm/° C.) of the semiconductor chip 20 than to that (e.g., 46 ppm/° C. or 120 ppm/° C.) of the second insulating layer 45. Consequently, in the semiconductor package 10, the thermal expansion coefficient at the side of the wiring structure 40, i.e., at the side opposite to the semiconductor chip 20, may be set closer to the thermal expansion coefficient at the side of the semiconductor chip 20. Accordingly, e.g., at cooling, after the heat treatment, the shrinkage amount caused at the side of the wiring structure 40 may be made closer to that at the side of the semiconductor chip 20. Thus, the semiconductor package 10 may be prevented from warping after the supporting body 60 is removed.

As examples 1 to 3 of the semiconductor package 10 according to the first embodiment, the warpage preventing member 50 made of silicon, the same made of glass (i.e., alkali-free glass) and the same made of a 42-alloy are implemented. In examples 1 to 3, the warpage preventing member 50 is provided on the front most surface of the wiring structure 40. Table 1 describes results of evaluation of the warpage amounts at room temperature and high temperature (i.e., 260° C.) of the examples 1 to 3, and the comparative example, based on a shadow moiré method.

TABLE 1

|  | Comparative Example | Example 1 | Example 2 | Example 3 |
|---|---|---|---|---|
| Presence/Absence of Warpage Preventing Member | Absent | Present | Present | Present |
| Material of Warpage Preventing Member | — | Silicon | Glass (Alkali-free Glass) | 42-alloy |
| Thermal Expansion Coefficient CTE (ppm/° C.) | Room Temperature 46/ High Temperature 120 | 3.4 | 3.25 | 4.3 |
| Young's Modulus E (GPa) | Room Temperature 4/ High Temperature 1.6 | 200 | 64 | 147 |
| Normalized warpage Amount L at Room Temperature | −100 | −36.7 | −42.6 | −39.1 |
| Normalized warpage Amount L at 260° C. | 62.2 | 29.1 | 55.9 | 34.4 |

In Table 1, normalized warpage amounts are described by assuming that a warpage amount at room temperature of the comparative example is −100%.

As described in Table 1, by providing the warpage preventing member made of silicon, glass, or a 42-alloy, the absolute value of the warpage amount is reduced to half or less, as compared with the case of providing no warpage preventing member.

According to the first embodiment, the stiffness of the semiconductor package may be enhanced by causing the warpage preventing member 50 to have a Young's modulus higher than that of the wiring structure 40, thereby reducing the warpage amount of a semiconductor package.

There is assumed a model in which the size of the semiconductor chip 20 as viewed from above is 8 mm×8 mm, the thickness thereof is 0.1 mm, the size of the semiconductor package 10 as viewed from above is 12 mm×12 mm, and the thickness thereof is 0.5 mm. Table 2 explains warpage amounts calculated by changing the thermal expansion coefficient CTE and the Young's modulus $E$ of the warpage preventing member 50 while maintaining the physical properties of the semiconductor chip 20, the resin portion 30 and the wiring structure 40.

TABLE 2

|  |  | \multicolumn{6}{c}{Thermal Expansion Coefficient CTE (ppm/° C.) of Warpage Preventing Member} |
| --- | --- | --- | --- | --- | --- | --- | --- |
|  |  | 3 | 9 | 15 | 21 | 27 | 29 |
| Young's Modulus E (GPa) of Warpage Preventing Member | 50 | 35.6% | 50.6% | 65.3% | 80.2% | 95.0% | 100.0% |
|  | 100 | 17.9% | 36.7% | 55.7% | 74.4% | 93.2% | 99.5% |
|  | 150 | 8.4% | 29.6% | 50.6% | 71.5% | 92.4% | 99.4% |
|  | 200 | 2.5% | 24.8% | 47.3% | 69.7% | 92.1% | 99.4% |

In a case where the thermal expansion coefficient CTE and the Young's modulus E of the warpage preventing member 50 are 29 ppm/° C. and 50 gigapascals (GPa), respectively, the thermal expansion coefficient CTE and the Young's modulus E thereof are substantially equal to those of the insulating layer, respectively. Thus, this condition corresponds to a case where no warpage preventing member 50 is provided. Table 2 describes the absolute values of the warpage amount normalized by assuming that the warpage amount is 100% in the case where the thermal expansion coefficient CTE and the Young's modulus E of the warpage preventing member 50 are 29 ppm/° C. and 50 GPa, respectively.

In a case where the thermal expansion coefficient CTE of the warpage preventing member 50 is made closer to that CTE (i.e., 3.4 ppm/° C.) of silicon by being reduced from 29 ppm/° C. to 3 ppm/° C., and where the Young's modulus E of the warpage preventing member 50 is made closer to that E (i.e., 200 GPa) of silicon by being increased from 50 GPa to 200 GPa, the warpage amount of the semiconductor package is reduced. When the thermal expansion coefficient CTE and the Young's modulus E of the warpage preventing member 50 are 9 ppm/° C. and 50 GPa, respectively, the warpage amount thereof may be reduced substantially to half, as compared with the case where the warpage preventing member 50 is not provided. When the thermal expansion coefficient CTE and the Young's modulus E of the warpage preventing, member 50 are 3 ppm/° C. and 200 GPa, respectively, that is, when the warpage preventing member 50 is made of silicon, the warpage amount is substantially 0.

According to the first embodiment, the warpage preventing member having the thermal expansion coefficient closer to that of the semiconductor chip than to that of the wiring structure is provided above the resin portion. Consequently, the semiconductor package may be prevented from warping after the supporting body is removed. In addition, the stiffness of the semiconductor package may be enhanced.

Second Embodiment

In a second embodiment, a case where an actual chip is provided as a warpage preventing member is exemplified. The description of components of the second embodiment, which are common to the first embodiment, is omitted. The following description of the second embodiment is focused on components, which differ from those of the first embodiment.

Structure According to Second Embodiment

Figure 15:
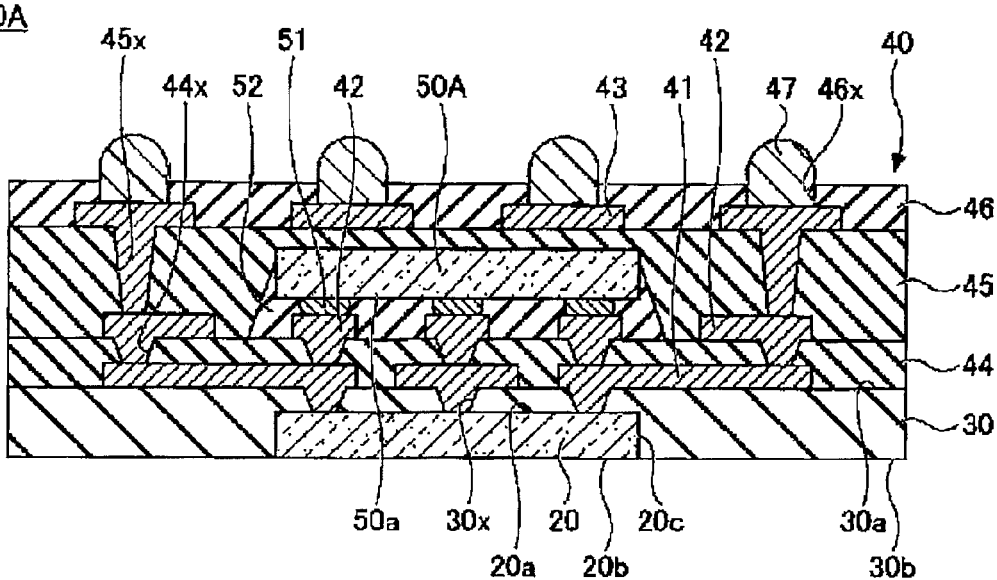
FIG. 15 cross-sectionally illustrates a semiconductor package according to a second embodiment.

FIG. 15 cross-sectionally illustrates a semiconductor package according to the second embodiment. Referring to FIG. 15, a semiconductor package 10A differs from the semiconductor package 10 illustrated in FIG. 1 in that the semiconductor package 10A employs an electronic component as the warpage preventing member. More specifically, a chip 50A is provided in a facedown state in the semiconductor package 10A.

Structures of the semiconductor chip 20 and the resin portion 30 are common between the semiconductor package 10A according to the second embodiment and the semiconductor package 10 according to the first embodiment, respectively.

An electronic component may be used as the chip 50A serving as the warpage preventing member. For example, the chip 50A may be a semiconductor chip in which a semiconductor integrated circuit (not shown) is formed at one surface 50a. The thickness of the chip 50A may be about 50 µm. The surface 50a of the semiconductor chip 50 may also be referred to as a "circuit forming surface 50a".

For example, a glass substrate may be used as a substrate of the chip 50A, in stead of semiconductor substrates, e.g., a silicon substrate. When the glass substrate is used, the chip 50A may be configured such that a semiconductor layer made of $TiO_2$ and a wire made of Au are formed on the glass substrate. Alternatively, as the chip 50A, various electronic components, e.g., an optical element, a microelectromechanical system (MEMS) element, a chip capacitor, an inductor element, and a resistor element may be used instead of a semiconductor chip.

The chip 50A is provided in the second insulating layer 45. The chip 50A has a thermal expansion coefficient closer to that of the semiconductor chip 20 than to that of the wiring structure 40. Consequently, the semiconductor package 10A may be prevented from warping after the supporting body 60 is removed.

The chip 50A is flip-chip-connected to the second wiring layer 42 via solder bumps 51 in a state where the circuit forming surface 50a faces the circuit forming surface 20a of the semiconductor chip 20. Consequently, the chip 50A and the semiconductor chip 20 are electrically connected to each other via each wiring layer. The space between the circuit forming surface 50a of the chip 50A and the first insulating layer 44 is filled with an underfill resin 52. A side surface of the chip 50A may be covered with the underfill resin 52.

The chip 50A is provided as the warpage preventing member. The functions of the entire semiconductor package 10A may be enhanced by adding the functions of, e.g., a memory, a logical-element or the like to those of the chip 50A.

Manufacturing Method According to Second Embodiment

A manufacturing method for a semiconductor package according to the second embodiment is similar to that for a semiconductor package according to the first embodiment, which has been described with reference to FIGS. 3 to 11, except the steps illustrated in FIGS. 7 to 11. The description of similar steps is omitted According to the second embodiment, after the step illustrated in FIG. 6, the steps illustrated in FIGS. 16 to 20 are performed, instead of the steps illustrated in FIGS. 7 to 11.

FIGS. 16 to 20 are cross-sectional views exemplifying a manufacturing process for a semiconductor package according to the second embodiment. In FIGS. 16 to 20, the same portion as that illustrated in FIG. 15 is designated with the same reference numeral, and the description thereof may be omitted. Reference character E shown in each of FIGS. 16 to 20 indicates a position at which the structure is cut after a step illustrated in FIG. 20.

Figure 16:
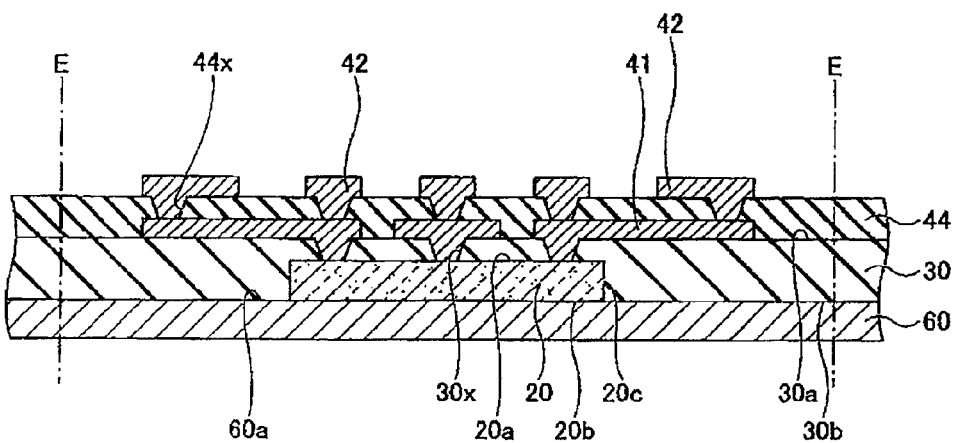
FIGS. 16 to 20 illustrate a process of manufacturing a semiconductor package according to the second embodiment.

In the step illustrated in FIG. 16, the first insulating layer 44 and the second wiring layer 42 are formed.

Similarly to the step illustrated in FIG. 7, the first insulating layer 44 is formed. Then, each first via-hole 44x is formed in the first insulating layer 44. Here, the first via-hole 44x is formed also at a position where the circuit forming surface 50a of the chip 50A is to be electrically connected to the first wiring layer 41. Then, similarly to the step illustrated in FIG. 7, each second wiring layer 42 is formed on the first insulating layer 44 to be electrically connected to the first wiring layer 41 via the via-hole 44x.

Figure 17:
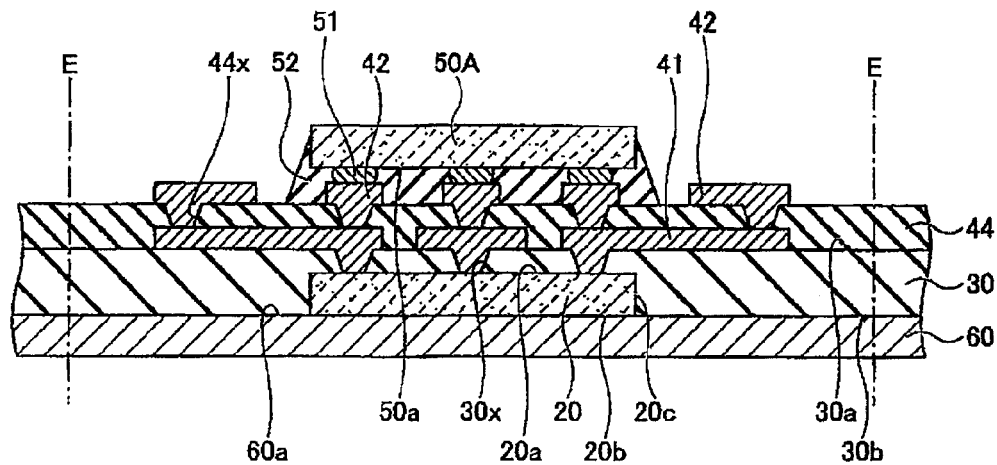

In the step illustrated in FIG. 17, the chip 50A is arranged on the first insulating layer 44 in a facedown state, as the warpage preventing member.

For example, as in the step for individualization of the semiconductor chip 20, a substrate for chips is preliminary prepared. The thickness of the substrate (i.e., the thickness of the chip 50A) may be set at, e.g., about 50 μm. The solder bumps 51 are preliminarily formed on electrode pads (not shown), which are formed on a surface serving as the circuit forming surface 50a of each individualized chip 50A. Each individualized chip 50A having a circuit forming surface 50a on which the solder bumps 51 are formed is arranged on the first insulating layer 44, on which the second wiring layer 42 is formed, such that the circuit forming the surface 50a faces the semiconductor chip 20. Then, the electrode pads of the chip 50A are flip-chip-connected to the second wiring layer 42 via the solder bumps 51 by performing heat treatment.

Preferably, the chip 50A is arranged to be opposite to the semiconductor chip 20.

Then, the space between the circuit forming surface 50a of the chip 50A and the first insulating layer 44 is filled with the underfill resin 52 made of, e.g., an epoxy resin or the like. A side surface of the chip 50A may also be covered with the underfill resin 52.

Figure 18:
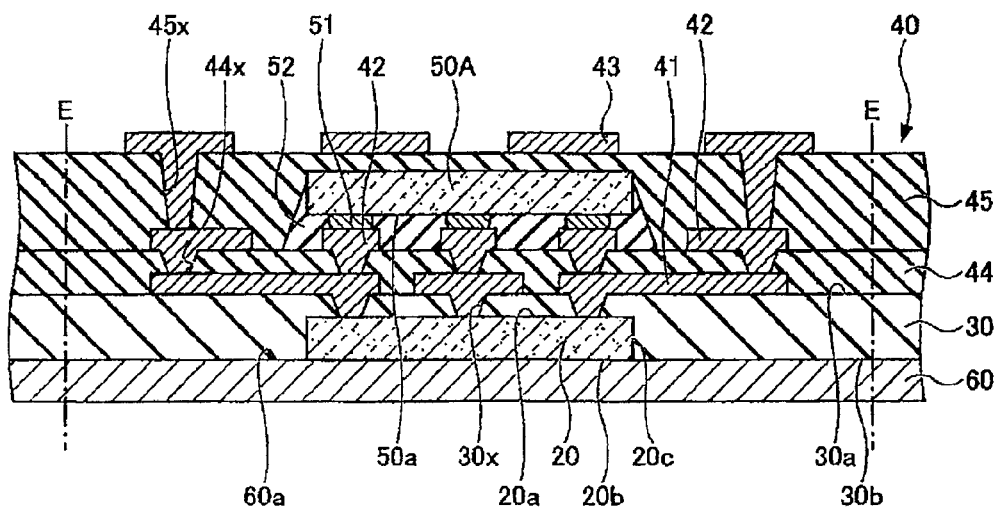

In the step illustrated in FIG. 18, the second insulating layer 45 and the third wiring layer 43 are formed.

First, similarly to the step illustrated in FIG. 9, the second insulating layer 45 is formed on the first insulating layer 44 to cover the second wiring layer 42. Then, the second via-holes 45x are formed in the second insulating layer 45. In addition, the third wiring layer 43 is formed on the second insulating layer 45.

Figure 19:
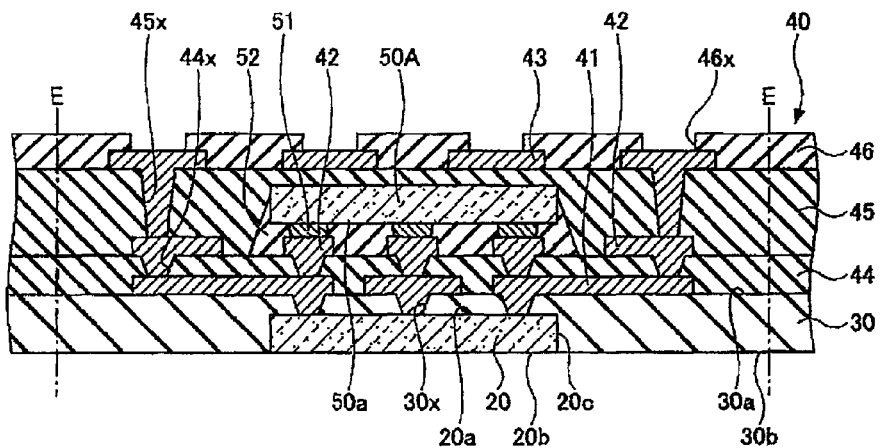

In the step illustrated in FIG. 19, the solder resist layer 46 is formed, and the supporting body 60 is removed after the opening 46x is formed, similarly to the step illustrated in FIG. 10.

Figure 20:
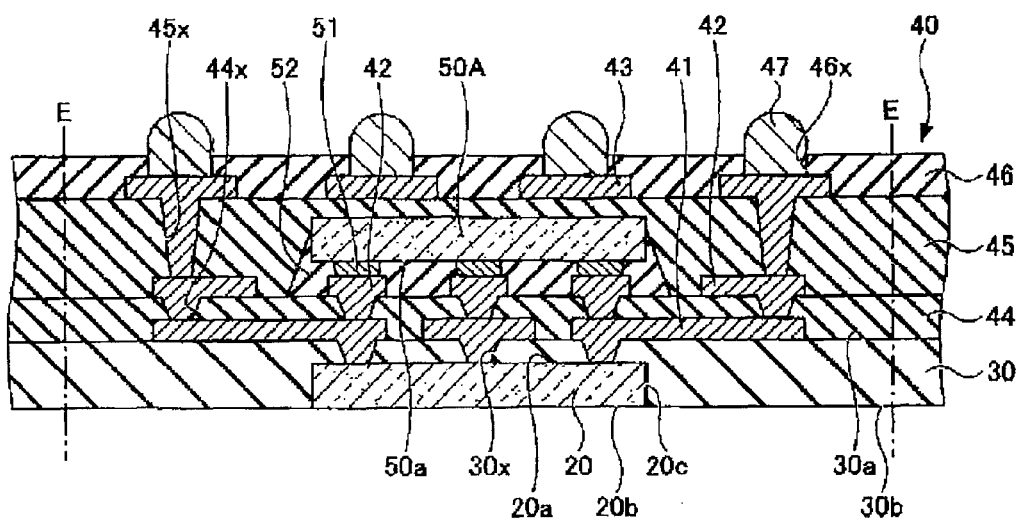

In the step illustrated in FIG. 20, the solder balls 47 are mounted on the third wiring layer 43 through the openings 46x, similarly to the step illustrated in FIG. 11.

Then, the structure illustrated in FIG. 20 is cut at, e.g., the position E to perform individualization. Consequently, the semiconductor package 10A illustrated in FIG. 15 are completed.

Third Embodiment

In a third embodiment, a case where the chip is provided in a faceup state unlike the second embodiment in which the chip is provided in a facedown state is exemplified. The description of components of the third embodiment, which are common to the first embodiment, is omitted. The following description of the third embodiment is focused on components, which differ from those of the first embodiment.

Structure According to Third Embodiment

Figure 21:
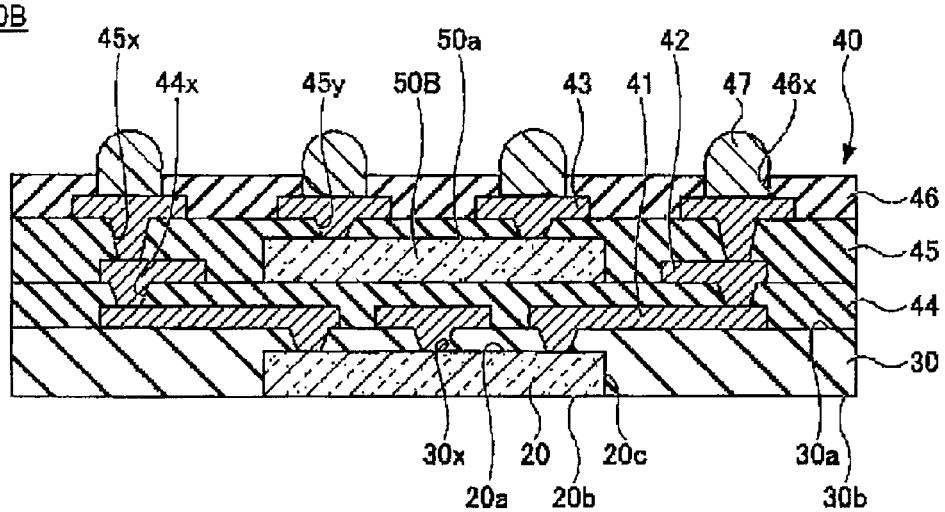
FIG. 21 cross-sectionally illustrates a semiconductor package according to a third embodiment.

FIG. 21 cross-sectionally illustrates a semiconductor package according to the third embodiment. Referring to FIG. 21, a semiconductor package 10B differs from the semiconductor package 10 illustrated in FIG. 1 in that a chip 50B in a faceup state is provided as the warpage preventing member.

Structures of the semiconductor chip 20 and the resin portion 30 are common between the semiconductor package 10B according to the third embodiment and the semiconductor package 10 according to the first embodiment, respectively.

The chip 50B serving as the warpage preventing member may have a structure similar to that of the chip 50A.

The chip 50B is provided in the second insulating layer 45. The chip 50B has a thermal expansion coefficient closer to that of the semiconductor chip 20 than to that or the wiring structure 40. Consequently, the semiconductor package 10B may be prevented from warping after the supporting body 60 is removed.

The chip 50B is provided so that a surface opposite to the circuit forming surface 50a touches the first insulating layer 44. The chip 50B is electrically connected to the third wiring layer 43 via the second via-hole 45y penetrating-through the second insulating layer 45. A wiring layer may be further provided so as to electrically connect the chip 50B and the semiconductor chip 20 each other.

The chip 50B is provided as the warpage preventing member. The functions of the entire semiconductor package 10B may be enhanced by adding the functions of, e.g., a memory, a logical-element or the like to those of the chip 50B.

Manufacturing Method According to Third Embodiment

A manufacturing method for a semiconductor package according to the third embodiment is similar to that for a semiconductor package according to the first embodiment, which has been described with reference to FIGS. 3 to 11, except for the steps illustrated in FIGS. 9 to 11. The description of similar steps is omitted.

Figure 22:
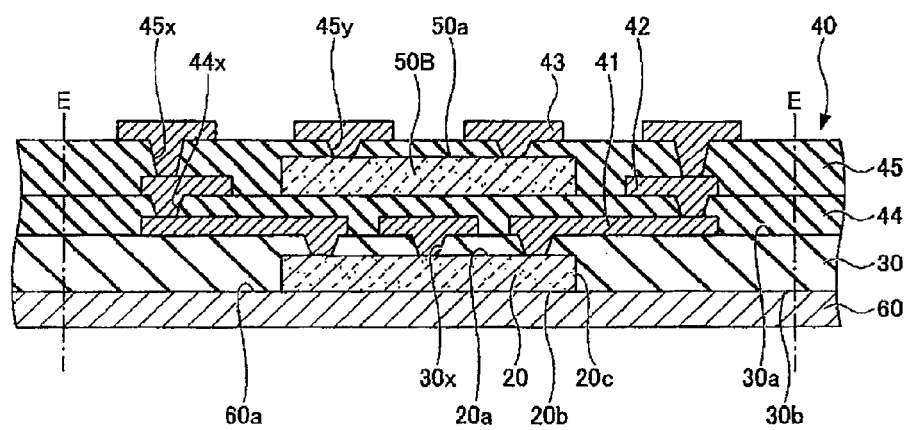
FIGS. 22 to 24 illustrate a process of manufacturing a semiconductor package according to the third embodiment.
Figure 23:
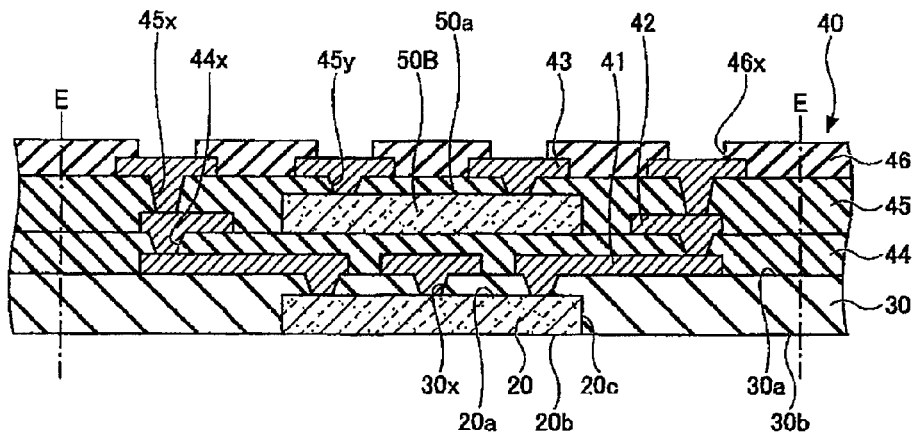
Figure 24:
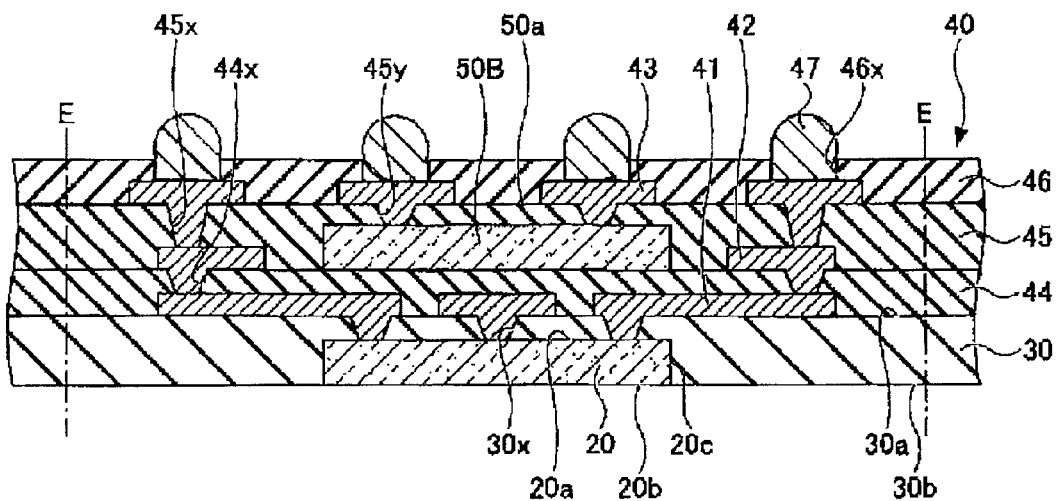

According to the third embodiment, after the step illustrated in FIG. 8, the steps illustrated in FIGS. 22 to 24 are performed, instead of the steps illustrated in FIGS. 9 to 11. However, in the step illustrated in FIG. 8, the chip 50B is fixed as the warpage preventing member such that a surface of the chip 50B, which is opposite to the surface 50a, touches the first insulating layer 44.

FIGS. 22 to 24 are cross-sectional views exemplifying a manufacturing process for a semiconductor package according to the third embodiment. In FIGS. 22 to 24, the same portion as that illustrated in FIG. 21 is designated with the same reference numeral, and the description thereof may be omitted. Reference character E shown in each of FIGS. 22 to 24 indicates a position at which the structure is cut after a step illustrated in FIG. 24.

In the step illustrated in FIG. 22, the second insulating layer 45 and the third wiring layer 43 are formed.

First, similarly to the step illustrated in FIG. 9, the second insulating layer 45 is formed on the first insulating layer 44 to cover the second wiring layer 42 and the chip 50B. Then, the second via-hole 45x is formed in the second insulating layer 45. Here, the second via-hole 45y is also formed in the second insulating layer 45 so as to expose electrode pads (not shown) formed on the circuit forming surface 50a. Then, the third wiring layer 43 is formed on the second insulating layer 45 to be electrically connected to not only the second wiring layer 42 through the second via-hole 45x, but also to the electrode pads (not shown) on the circuit forming surface 50a through the second via-hole 45y.

In the step illustrated in FIG. 23, the solder resist layer 46 is formed, and the supporting body 60 is removed after the opening 46x is formed, similarly to the step illustrated in FIG. 10.

In the step illustrated in FIG. 24, the solder balls 47 are mounted on the third wiring layer 43 through the openings 46x, similarly to the step illustrated in FIG. 11.

Then, the structure illustrated in FIG. 24 is cut at, e.g., the position E to individualize the semiconductor packages. Consequently, the semiconductor package 10B illustrated in FIG. 21 is completed.

Fourth Embodiment

In a fourth embodiment, a case where, on a surface opposite to the wiring structure in the first embodiment, an electrode terminal electrically connected to the first wiring layer is further provided is exemplified. The description of components of the fourth embodiment, which are common to the first embodiment, is omitted. The following description of the fourth embodiment is focused on components, which differ from those of the first embodiment.

Structure According to Fourth Embodiment

Figure 25:
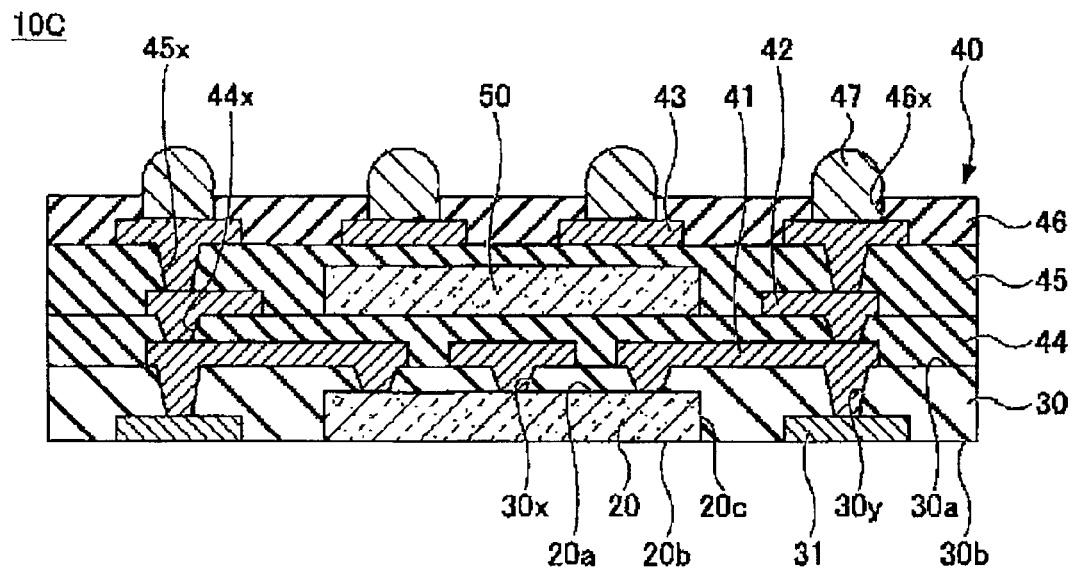
FIG. 25 cross-sectionally illustrates a semiconductor package according to a fourth embodiment.

FIG. 25 cross-sectionally illustrates a semiconductor package according to the fourth embodiment. Referring to FIG. 25, a semiconductor package 10C differs from the semiconductor package 10 illustrated in FIG. 1 in that the electrode terminal 31 electrically connected to the first wiring layer 41 is provided.

Structures of the semiconductor chip 20 and the warpage preventing member 50 are common between the semiconductor package 10C according to the fourth embodiment and the semiconductor package 10 according to the first embodiment, respectively.

The semiconductor package 10C according to the fourth embodiment is similar to the semiconductor package 10 according to the first embodiment in that the resin portion 30 of the semiconductor package 10C is formed to cover the circuit forming surface 20a and the surface (side surface) 20c of the semiconductor chip 20.

On the other hand, the electrode terminal 31 is formed in the surface 30b of the resin portion 30 of the semiconductor package 10C. For example, the electrode terminal 31 of the semiconductor package 10C is configured such that a Cu-layer or the like is stacked on one of, e.g., an Au-layer, an Au-layer/a Ni-layer, an Au-layer/a Pd-layer/a Ni-layer, and the like in a direction from a side of the surface 30b towards the wiring structure 40. The diameter of the electrode terminal 31 may be set at, e.g., about 200 μm.

The layers of the wiring structure 40 of the semiconductor package 10C other than the first wiring layer 41 are similar to associated layers of the wiring structure 40 of the semiconductor package 10 according to the first embodiment.

In the semiconductor package 10C, the first wiring layer 41 is formed on the surface 30a of the resin portion 30 to be electrically connected to the electrode pads (not shown) formed on the circuit forming surface 20a of the semiconductor chip 20 via the via-holes 30x, and the first wiring layer 41 is electrically connected to each electrode terminal 31 formed on the surface 30b of the resin portion 30 via the associated via-hole 30y penetrating-through the resin portion 30.

Manufacturing Method According to Fourth Embodiment

Next, a method for manufacturing a semiconductor package according to the fourth embodiment is described. FIGS. 26 to 34 are cross-sectional views exemplifying a process of manufacturing a semiconductor package according to the fourth embodiment. In FIGS. 26 to 34, the same portion as that illustrated in FIG. 25 is designated with the same reference numeral, and the description thereof may be omitted. Reference character E shown in each of FIGS. 26 to 34 indicates a position at which the structure is cut after a step illustrated in FIG. 34.

A manufacturing method for a semiconductor package according to the fourth embodiment, which is illustrated in FIGS. 26 to 34, is similar to that for a semiconductor package according to the first embodiment illustrated in FIGS. 3 to 11, except that the electrode terminals 31 are formed in the supporting body 60, and that the via-holes 30y are formed in the resin portion 30. The description of the steps common to those illustrated in FIGS. 3 to 11 is omitted.

Figure 26:
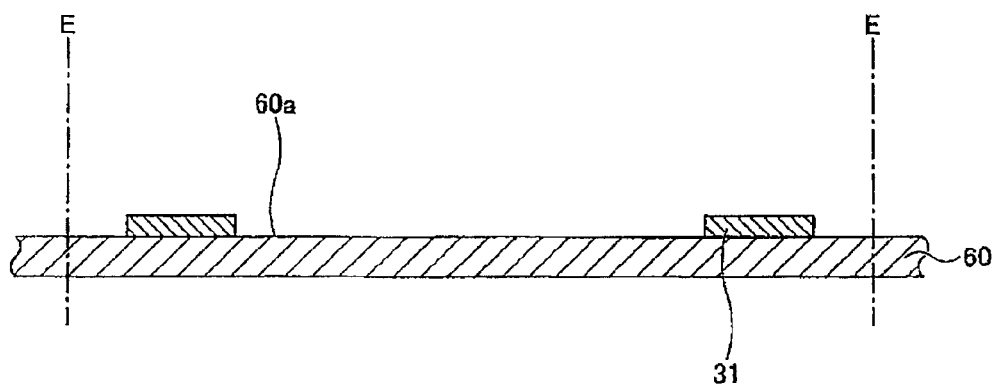
FIGS. 26 to 34 illustrate a process of manufacturing a semiconductor package according to the fourth embodiment.

First, in the step illustrated in FIG. 26, the supporting body 60 is prepared, similarly to the step illustrated in FIG. 3.

Here, according to the fourth embodiment, a resist pattern having an opening for forming the electrode terminals 31 is formed on the supporting body 60. Then, the electrode terminals 31 are formed by electrolytic plating using the supporting body 60 as the power feeding layer. More specifically, an Au-layer, a Pd-layer, and a Ni-layer are stacked on the supporting body 60 exposed through the opening of the resist pattern in this order. Then, a Cu-layer is stacked on the stacked metal layers by electrolytic plating. Then, the resist pattern is removed, and the electrode terminals 31 are formed.

Figure 27:
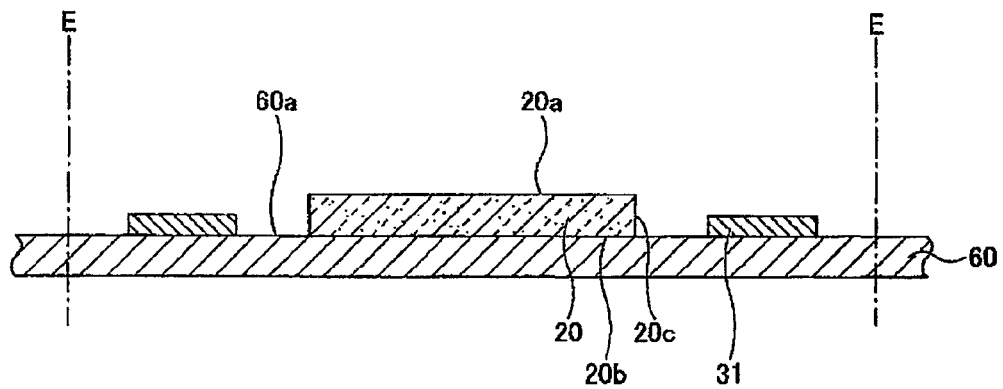

In the step illustrated in FIG. 27, the semiconductor chip 20 is arranged on the surface 60a of the prepared supporting body 60, similarly to the step illustrated in FIG. 4.

Figure 28:
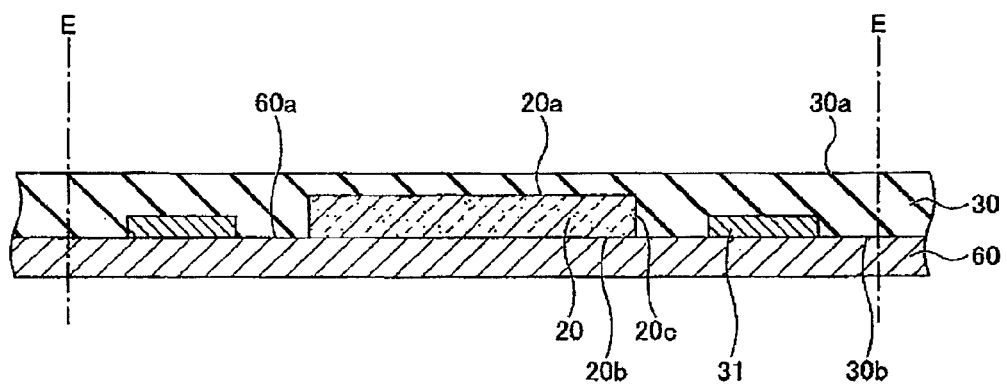

In the step illustrated in FIG. 28, the resin portion 30 is formed on the surface 60a of the supporting body 60 to cover the semiconductor chip 20 and the electrode terminals 31, similarly to the step illustrated in FIG. 5.

Figure 29:
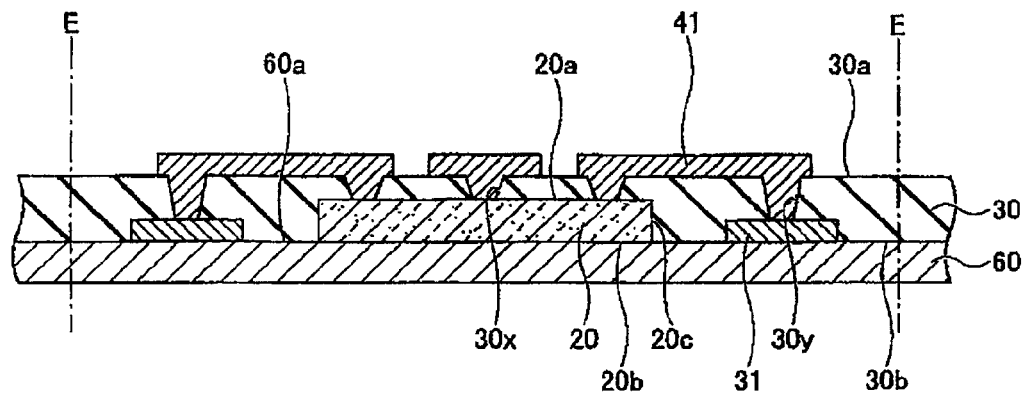

In the step illustrated in FIG. 29, the first wiring layer 41 is formed on the surface 30a of the resin portion 30 to be electrically connected to the semiconductor chip 20, similarly to the step illustrated in FIG. 6.

Here, in the step illustrated in FIG. 29, the via-hole 30y is previously formed in the resin portion 30 to penetrate therethrough, by a laser processing method, a blast processing method or the like, thereby exposing the electrode terminals 31 formed on the surface 60a of the supporting body 60. Then, the first wiring layer 41 is formed on the surface 30a of the resin portion 30 to be electrically connected to not only the electric pad (not shown) of the circuit forming surface 20a through the via-hole 30x, but also to the electrode terminal 31 through the via-hole 30y.

Figure 30:
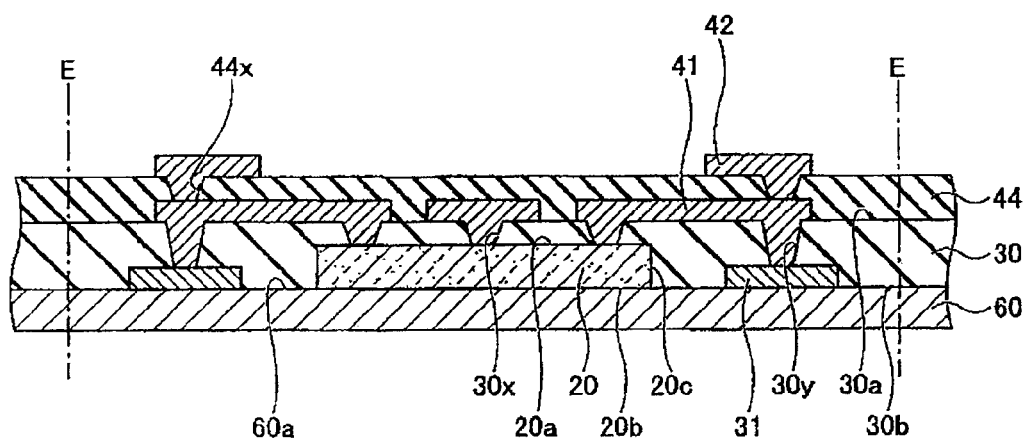

In the step illustrated in FIG. 30, the first insulating layer 44 and the second wiring layer 42 are formed, similarly to the step illustrated in FIG. 7.

Figure 31:
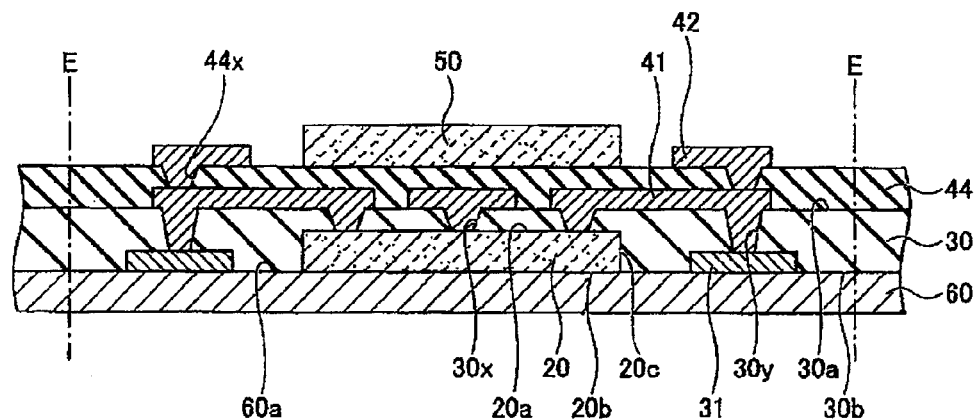

In the step illustrated in FIG. 31, the warpage preventing member 50 is arranged on the first insulating layer 44, similarly to the step illustrated in FIG. 8.

Figure 32:
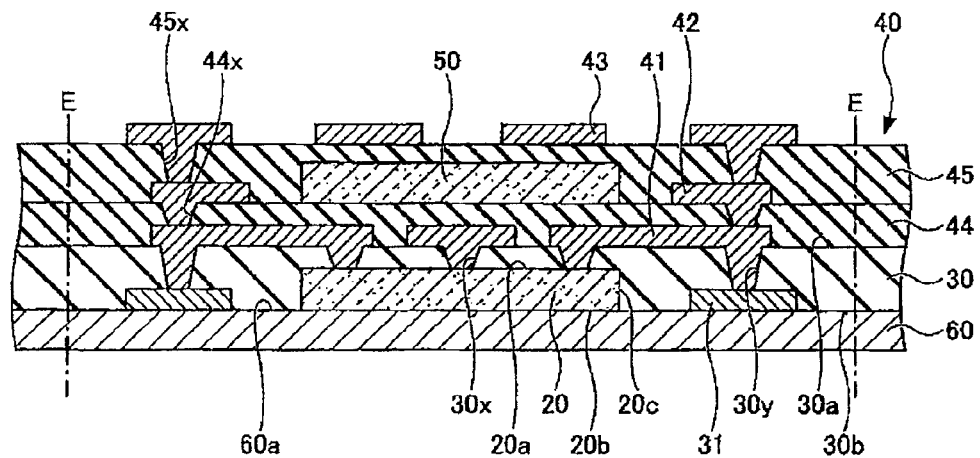

In the step illustrated in FIG. 32, the second insulating layer 45 and the third wiring layer 43 are formed, similarly to the steps illustrated in FIG. 9.

Figure 33:
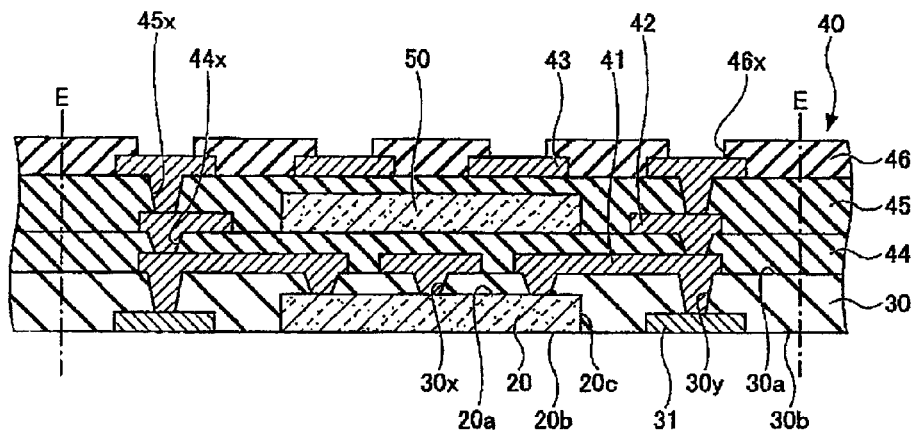

In the step illustrated in FIG. 33, the solder resist layer 46 is formed, and the supporting body 60 is removed after the opening 46x is formed, similarly to the step illustrated in FIG. 10, thereby exposing the electrode terminal 31 on the surface 30b of the resin portion 30.

Figure 34:
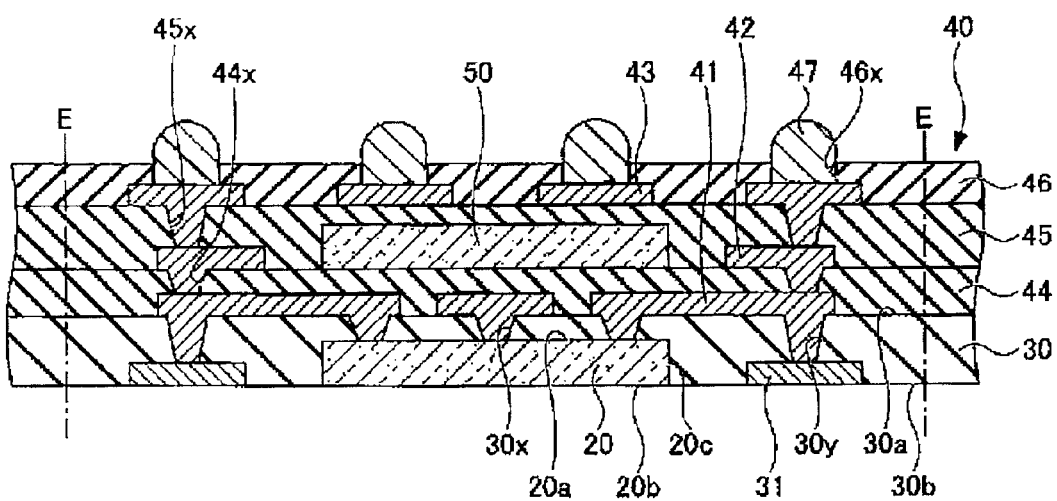

In the step illustrated in FIG. 34, the solder balls 47 are mounted on portions of the third wiring layer 43 exposed through the openings 46x, similarly to the step illustrated in FIG. 11.

Then, the structure illustrated in FIG. 34 is cut at, e.g., the position E so that the semiconductor packages are individualized. Consequently, the semiconductor package 10C illustrated in FIG. 25 is completed.

Even according to the fourth embodiment, the warpage preventing member having a thermal expansion coefficient closer to that of the semiconductor chip than to that of the wiring structure is provided above the resin portion. Consequently, the semiconductor package may be prevented from warping after the supporting body is removed. In addition, the stiffness thereof may be enhanced.

Fifth Embodiment

In a fifth embodiment, a case where, on a surface opposite to the wiring structure in the second embodiment, an electrode terminal electrically connected to the first wiring layer is further provided is exemplified. The description of components of the fifth embodiment, which are common to the second embodiment, is omitted. The following description of the fifth embodiment is focused on components, which differ from those of the second embodiment.

Figure 35:
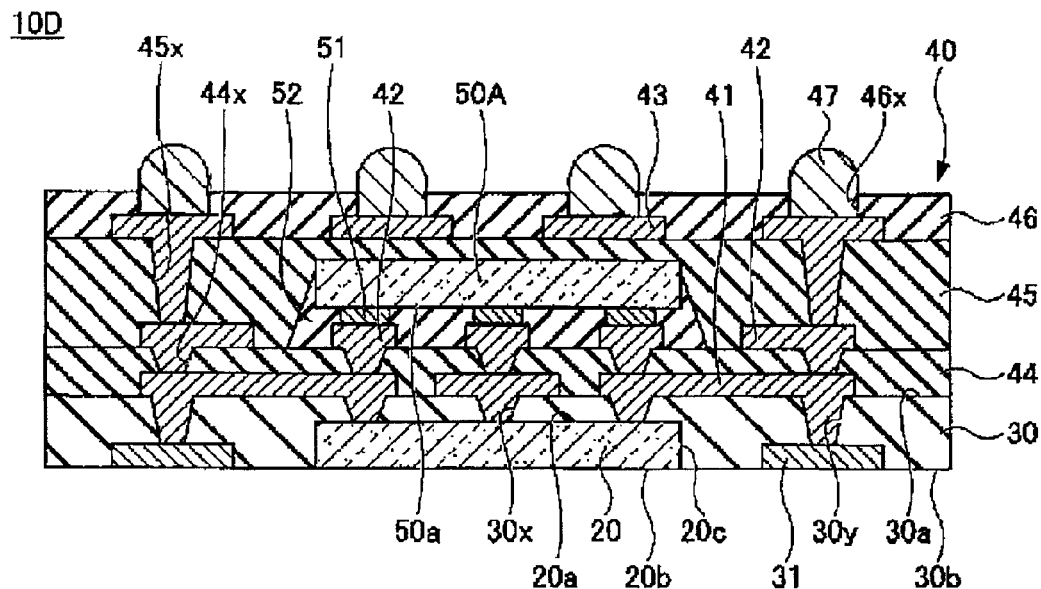
FIG. 35 cross-sectionally illustrates a semiconductor package according to a fifth embodiment.

FIG. 35 cross-sectionally illustrates a semiconductor package according to the fifth embodiment. Referring to FIG. 35, a semiconductor package 10D differs from the semiconductor package 10A illustrated in FIG. 15 in that the electrode terminal 31 electrically connected to the first wiring layer 41 is provided.

Structures of the semiconductor chip 20 and the chip 50A are common between the semiconductor package 10D according to the fifth embodiment and the semiconductor package 10A according to the second embodiment, respectively.

The semiconductor package 10D according to the fifth embodiment is similar to the semiconductor package 10A according to the second embodiment in that the resin portion 30 of the semiconductor package 10D is formed to cover the circuit forming surface 20a and the surface (side surface) 20c of the semiconductor chip 20.

On the other hand, the electrode terminal 31 is formed on the surface 30b of the resin portion 30. The electrode terminal 31 may be formed as in the fourth embodiment.

The layers of the wiring structure 40 other than the first wiring layer 41 of the semiconductor package 10D according to the fifth embodiment are similar to associated layers of the wiring structure 40 of the semiconductor package 10A according to the second embodiment.

The first wiring layer 41 of the semiconductor package 10D is formed on the surface 30a of the resin portion 30 and electrically connected to electrode pads (not shown) formed on the circuit forming surface 20a of the semiconductor chip 20. The first wiring layer 41 is also electrically connected to the associated electrode terminal 31 formed on the surface 30b of the resin portion 30 via the associated via-hole 30y.

A manufacturing method for a semiconductor package according to the fifth embodiment is similar to that for a semiconductor package according to the second embodiment except that the electrode terminal 31 is formed on the supporting body 60, and that the via-hole 30y is formed in the resin portion 30.

Even according to the fifth embodiment, the chip having a thermal expansion coefficient closer to that of the semiconductor chip than to that of the wiring structure is provided above the resin portion. Consequently, the semiconductor package may be prevented from warping after the supporting body is removed. In addition, the stiffness thereof may be enhanced.

Sixth Embodiment

In a sixth embodiment, a case where, on a surface opposite to the wiring structure in the third embodiment, an electrode terminal electrically connected to the first wiring layer is further provided is exemplified. The description of components of the sixth embodiment, which are common to the third embodiment, is omitted. The following description of the sixth embodiment is focused on components, which differ from those of the third embodiment.

Figure 36:
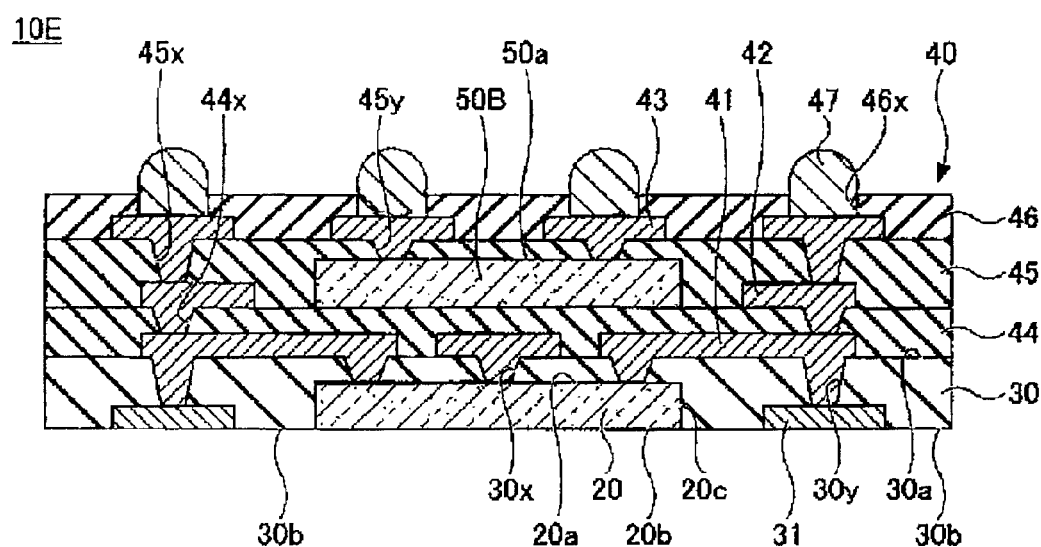
FIG. 36 cross-sectionally illustrates a semiconductor package according to a sixth embodiment.

FIG. 36 cross-sectionally illustrates a semiconductor package according to the sixth embodiment. Referring to FIG. 36, a semiconductor package 10E differs from the semiconductor package 10B illustrated in FIG. 21 in that each electrode terminal 31 electrically connected to the first wiring layer 41 is provided.

Structures of the semiconductor chip 20 and the chip 50B are common between the semiconductor package 10E according to the sixth embodiment and the semiconductor package 10B according to the third embodiment, respectively.

The semiconductor package 10E according to the sixth embodiment is similar to the semiconductor package 10B according to the third embodiment in that the resin portion 30 of the semiconductor package 10E is formed to cover the circuit forming surface 20a and the surface (side surface) 20c of the semiconductor chip 20.

On the other hand, the electrode terminal 31 is formed on the surface 30b of the resin portion 30. The electrode terminal 31 may be formed as in the fourth embodiment.

The layers of the wiring structure 40 other than the first wiring layer 41 of the semiconductor package 10E according to the sixth embodiment are similar to associated layers of the wiring structure 40 of the semiconductor package 10B according to the third embodiment.

The first wiring layer 41 of the semiconductor package 10E is formed on the surface 30a of the resin portion 30 and electrically connected to electrode pads (not shown) formed on the circuit forming surface 20a of the semiconductor chip 20. The first wiring layer 41 is also electrically connected to the electrode terminal 31 formed on the surface 30b of the resin portion 30 via the via-hole 30y.

A manufacturing method for a semiconductor package according to the sixth embodiment is similar to that for a semiconductor package according to the third embodiment except that the electrode terminal 31 is formed on the supporting body 60, and that each via-hole 30y is formed in the resin portion 30.

Even according to the sixth embodiment, the chip having a thermal expansion coefficient closer to that of the semiconductor chip than to that of the wiring structure is provided above the resin portion. Consequently, the semiconductor package may be prevented from warping after the supporting body is removed. In addition, the stiffness thereof may be enhanced.

While the embodiments are exemplified, the invention is not limited thereto, and various modifications/substitutions may be adapted thereto without departing from the scope of Claims.

The invention claimed is:

1. A semiconductor package comprising:
   a semiconductor chip;
   a resin portion formed to cover the semiconductor chip;
   a wiring structure formed on the resin portion and electrically connected to the semiconductor chip; and
   a warpage preventing member provided above the resin portion to have a thermal expansion coefficient closer to that of the semiconductor chip than to that of the wiring structure,
   wherein the warpage preventing member is made of silicon, glass, ceramic, or compound semiconductor,
   wherein the wiring structure includes a plurality of wiring layers and a plurality of insulating layers, which are alternately stacked, with at least one of the plurality of wiring layers being electrically connected to the semiconductor chip, and a via that passes through the plurality of insulating layers and electrically connects the plurality of wiring layers to each other,
   wherein the warpage preventing member is spaced and electrically independent from the plurality of wiring layers of the wiring structure, the via of the wiring structure, and the semiconductor chip,
   wherein the warpage preventing member is disposed in one of the insulating layers so as to face the semiconductor chip, and
   wherein the warpage preventing member is a dummy chip.

2. The semiconductor package of claim 1,
   wherein the warpage preventing member is provided in the wiring structure at a side opposite to the resin portion.

3. The semiconductor package of claim 1,
   wherein the warpage preventing member has a Young's modulus higher than that of the wiring structure.

4. The semiconductor package of claim 1,
   wherein the plurality of insulating layers of the wiring structure includes an insulating layer that is positioned most far from the semiconductor chip among the plurality of insulating layers, and the warpage preventing member is provided in the insulating layer that is positioned most far from the semiconductor chip among the plurality of insulating layers of the wiring structure.

5. The semiconductor package of claim 4, wherein the semiconductor package includes only a single one of the warpage preventing member.

6. The semiconductor package of claim 4, wherein the warpage preventing member is made of glass.

7. The semiconductor package of claim 1, wherein the semiconductor package includes only a single one of the warpage preventing member.

8. The semiconductor package of claim 1, wherein the warpage preventing member is made of glass.

9. A semiconductor package comprising:
   a semiconductor chip;
   a resin portion formed to cover the semiconductor chip;
   a wiring structure formed on the resin portion and electrically connected to the semiconductor chip; and
   a warpage preventing member provided above the resin portion to have a thermal expansion coefficient closer to that of the semiconductor chip than to that of the wiring structure,
   wherein the warpage preventing member is electrically independent from a wiring layer of the wiring structure,
   wherein the warpage preventing member is made of glass,
   wherein the warpage preventing member is disposed as to face the semiconductor chip, and
   wherein the warpage preventing member is a dummy chip.

* * * * *